US009385072B2

(12) United States Patent
Kanemoto

(10) Patent No.: US 9,385,072 B2
(45) Date of Patent: Jul. 5, 2016

(54) METHOD OF MANUFACTURING SEMICONDUCTOR DEVICE AND SEMICONDUCTOR DEVICE

(71) Applicant: RENESAS ELECTRONICS CORPORATION, Tokyo (JP)

(72) Inventor: Koichi Kanemoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/015,607

(22) Filed: Feb. 4, 2016

(65) Prior Publication Data

US 2016/0155710 A1 Jun. 2, 2016

Related U.S. Application Data

(62) Division of application No. 14/259,842, filed on Apr. 23, 2014, now Pat. No. 9,275,945.

(30) Foreign Application Priority Data

May 10, 2013 (JP) .................. 2013-099833

(51) Int. Cl.
*H01L 21/00* (2006.01)
*H01L 23/495* (2006.01)
*H01L 23/00* (2006.01)
*H01L 21/66* (2006.01)
*H01L 23/544* (2006.01)

(52) U.S. Cl.
CPC ........... *H01L 23/49575* (2013.01); *H01L 22/34* (2013.01); *H01L 23/49503* (2013.01); *H01L 23/49541* (2013.01); *H01L 23/49551* (2013.01); *H01L 23/544* (2013.01); *H01L 24/49* (2013.01); *H01L 24/85* (2013.01)

(58) Field of Classification Search
CPC ..... H01L 24/49; H01L 24/85; H01L 23/4957; H01L 23/49575
See application file for complete search history.

(56) References Cited

U.S. PATENT DOCUMENTS

| 7,466,024 | B2 | 12/2008 | Ito |
| 7,772,044 | B2 | 8/2010 | Ito |
| 7,804,176 | B2 | 9/2010 | Hanawa |
| 7,998,795 | B2 | 8/2011 | Ito |
| 8,237,267 | B2* | 8/2012 | Shinohara ......... H01L 23/49575 257/724 |
| 8,318,548 | B2 | 11/2012 | Yamashita |
| 2002/0180021 | A1* | 12/2002 | Lin ................... H01L 23/49575 257/686 |
| 2005/0218489 | A1 | 10/2005 | Satou |
| 2006/0170084 | A1 | 8/2006 | Masuda |
| 2006/0197210 | A1* | 9/2006 | Kim ...................... H01L 21/565 257/686 |
| 2009/0130996 | A1* | 5/2009 | Kudaishi ................. H01L 24/48 455/90.3 |
| 2010/0295166 | A1 | 11/2010 | Kim |
| 2011/0039376 | A1 | 2/2011 | Yamashita |
| 2014/0374890 | A1 | 12/2014 | Yamashita |

FOREIGN PATENT DOCUMENTS

| JP | 2004-356382 A | 12/2004 |
| JP | 2011-124487 A | 6/2011 |

* cited by examiner

*Primary Examiner* — Nicholas Tobergte
(74) *Attorney, Agent, or Firm* — Mattingly & Malur, PC

(57) ABSTRACT

Reliability of a semiconductor device is improved. A method of manufacturing a semiconductor device includes a step of arranging a plurality of semiconductor chips next to each other over a chip mounting surface of a die pad. Further, the method of manufacturing a semiconductor device includes a step of electrically coupling the semiconductor chip and the semiconductor chip via a wire. In this regard, a pad (chip-to-chip connection pad) of the semiconductor chip on a second bonding side in the step of coupling the wire is provided such that it is distantly located from a peripheral portion of a surface of the semiconductor chip.

8 Claims, 21 Drawing Sheets

METHOD OF MANUFACTURING SEMICONDUCTOR DEVICE AND SEMICONDUCTOR DEVICE

CROSS-REFERENCE TO RELATED APPLICATIONS

The application is a divisional application of Ser. No. 14/259,842, filed Apr. 23, 2014, the disclosure of Japanese Patent Application No. 2013-099833 filed on May 10, 2013 including the specification, drawings and abstract is incorporated herein by reference in its entirety.

BACKGROUND

The present invention relates to a semiconductor device and its manufacturing technique. In particular, it relates to a technique effective to be applied to a semiconductor device in which semiconductor chips arranged side by side are electrically coupled via a wire.

Japanese Patent Laid-open No. 2004-356382 (Patent Document 1) describes a semiconductor device in which two semiconductor chips arranged adjacent to each other, in a planar manner, over one die pad are electrically coupled via a wire.

Also, Japanese Patent Laid-open No. 2011-124487 (Patent document 2) describes a semiconductor device in which two semiconductor chips arranged adjacent to each other, in a planar manner, over a wiring substrate are electrically coupled via a wire.
[Patent Document 1]
Japanese Patent Laid-open No. 2004-356382
[Patent Document 2]
Japanese Patent Laid-open No. 2011-124487

SUMMARY

There is known a semiconductor device of the system in package (SiP) type in which a system is made by mounting several kinds of semiconductor chips in one semiconductor device. As for configurations of the SiP, there are a stack type semiconductor device in which one semiconductor chip is stacked over another semiconductor chip and a flatbed type semiconductor device in which one semiconductor chip is arranged adjacent to another semiconductor chip. The flatbed type is more effective than the stack type in that the semiconductor device can be made thinner and a length of a wire for coupling the semiconductor chip with a base material can be reduced.

In addition to the above semiconductor device, there is a die pad exposure type semiconductor device where a die pad over which semiconductor chips are mounted is exposed from a sealing body. In the case of the die pad exposure type semiconductor device, heat of semiconductor chips is easily released from the die pad, improving a heat dissipating characteristic thereof.

However, when the flatbed type is adopted in the die pad exposure type semiconductor device and two adjacent semiconductor chips are electrically coupled via a wire, it has been found out that there arises a problem of electric reliability at a joint portion of the wire.

Other objects and new features of the present invention will become apparent from the description of the specification and accompanying drawings.

A method of manufacturing a semiconductor device according to one embodiment of the invention includes a step of arranging a plurality of semiconductor chips next each other over a chip mounting surface of a die pad. Further, the method of manufacturing a semiconductor device includes a step of electrically coupling the above semiconductor chips via a wire. In this regard, a chip-to-chip connection pad of a first semiconductor chip being on a second bonding side in the step of coupling the wire is provided such that it is distantly located from a peripheral portion of a surface of the above first semiconductor chip.

According to one embodiment described above, it is possible to efficiently manufacture a semiconductor device whose package strength is improved.

BRIEF DESCRIPTION OF THE DRAWINGS

FIG. 3 is a perspective plan view showing an internal structure of the semiconductor device with a sealing body shown in FIG. 1 seen through.

DETAILED DESCRIPTION

Figure 1:
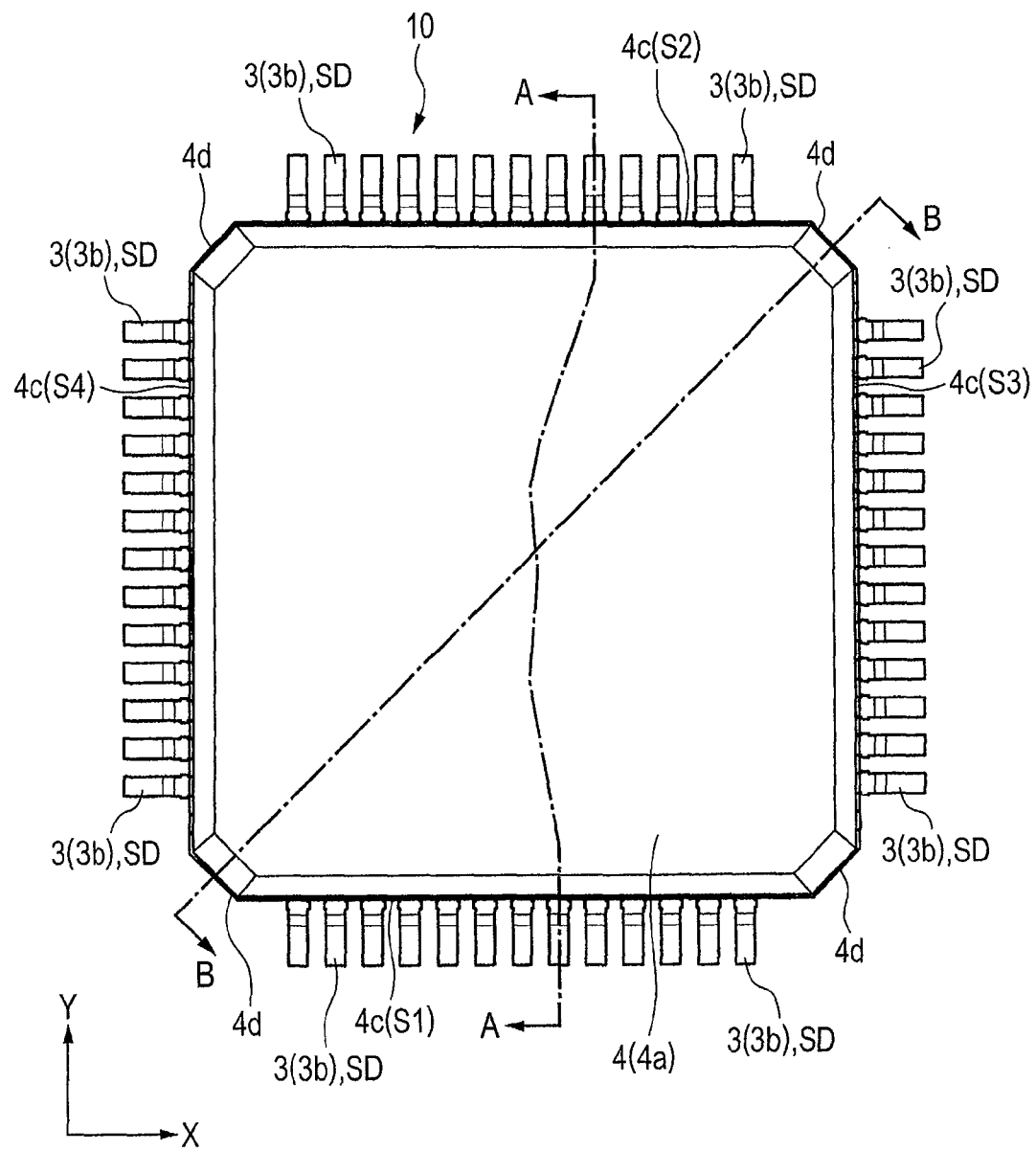
FIG. 1 is a top view showing a semiconductor device according to one embodiment of the present invention.

Explanation of Description Form, Basic Terms, and Usage in the Present Application In this application, although the description of embodiments are divided into a plurality of sections for convenience as required, they are not independent of each other, unless otherwise explicitly specified, regardless of the order of description; the sections may be respective parts of a single example; a section may be a detailed description of another; or a section may be a partial or entire variation of another. In addition, repetitive description of similar components is omitted in principle. The ingredients in the embodiments are not essential unless otherwise explicitly specified, or theoretically limited in numbers or obviously unlimited from the context.

Similarly in the description of the embodiments, the expression "X includes A" with regard to a material or ingredients does not exclude anything which includes components other than A, unless otherwise explicitly specified or obviously denied from the context. For example, it means "X including A as a major ingredient". For example, it is needless to say that a "silicon member" is not limited to pure silicon but may include SiGe (silicon-germanium) alloy and other multi-element alloys including silicon as the major ingredient, as well as a member including other additives or the like. It is also assumed that, unless otherwise explicitly specified, gold plate, Cu layer, or nickel plate may include a member having gold, Cu, or nickel as the major ingredient.

Furthermore, even if a particular numerical value or amount is mentioned, the numerical value may be more than or less than the particular value unless otherwise explicitly specified, or theoretically limited in numbers or obviously unlimited from the context.

In the drawings of the embodiments, identical or similar components are indicated by identical or similar symbols or reference numerals, and duplicate description thereof is basically omitted.

In the accompanying drawings, hatching on a cross section may be omitted where it unnecessarily adds to complication or where distinction with a space is apparent. There may also be a case that the background outline of a closed hole, in a plane, is omitted where it is apparent from the description. Furthermore, a place other than a cross section may be provided with hatching or dot patterns to explicitly indicate that it is a space or a border of a region.

First Embodiment

A technique to be explained in an embodiment below is widely applicable to a semiconductor device which has semiconductor chips and a sealing body for sealing the semiconductor chips. According to the present embodiment, as an example, there is described an aspect where the above technique is applied to the QFP (Quad Flat Package) type semiconductor device in which a plurality of leads being external terminals are exposed from each of four side surfaces of the sealing body for sealing semiconductor chips.

<Semiconductor Device>

Figure 2:
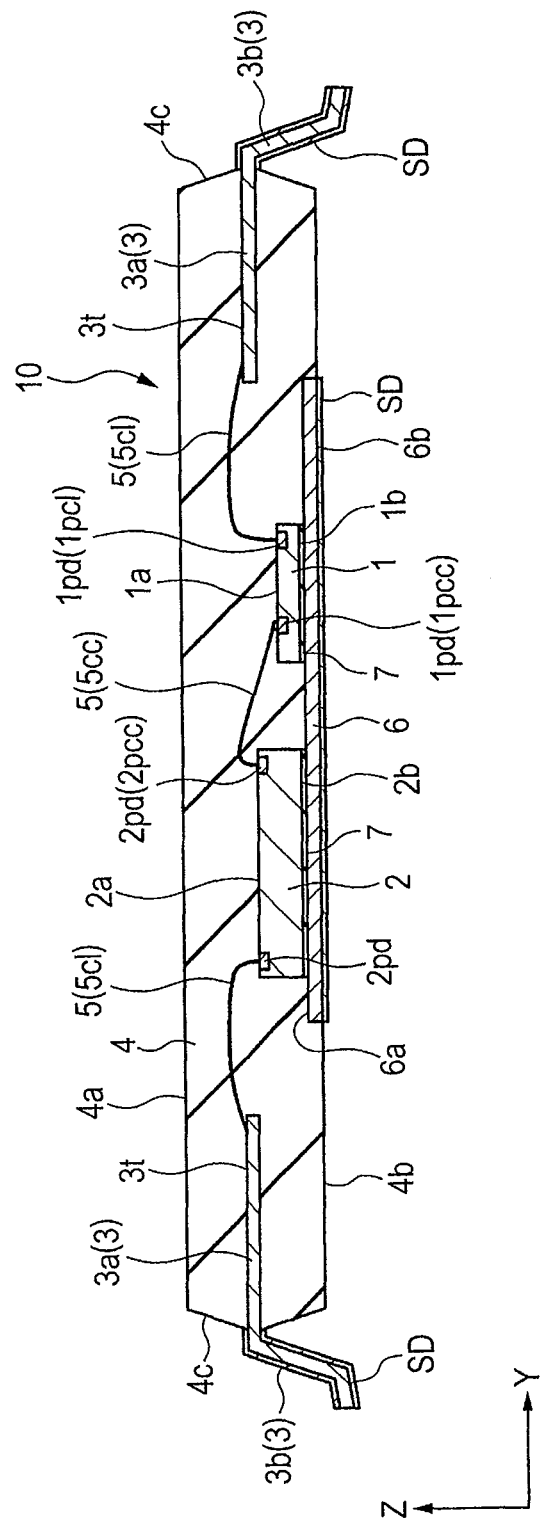
FIG. 2 is a cross-sectional view taken along line A-A of FIG. 1.
Figure 3:
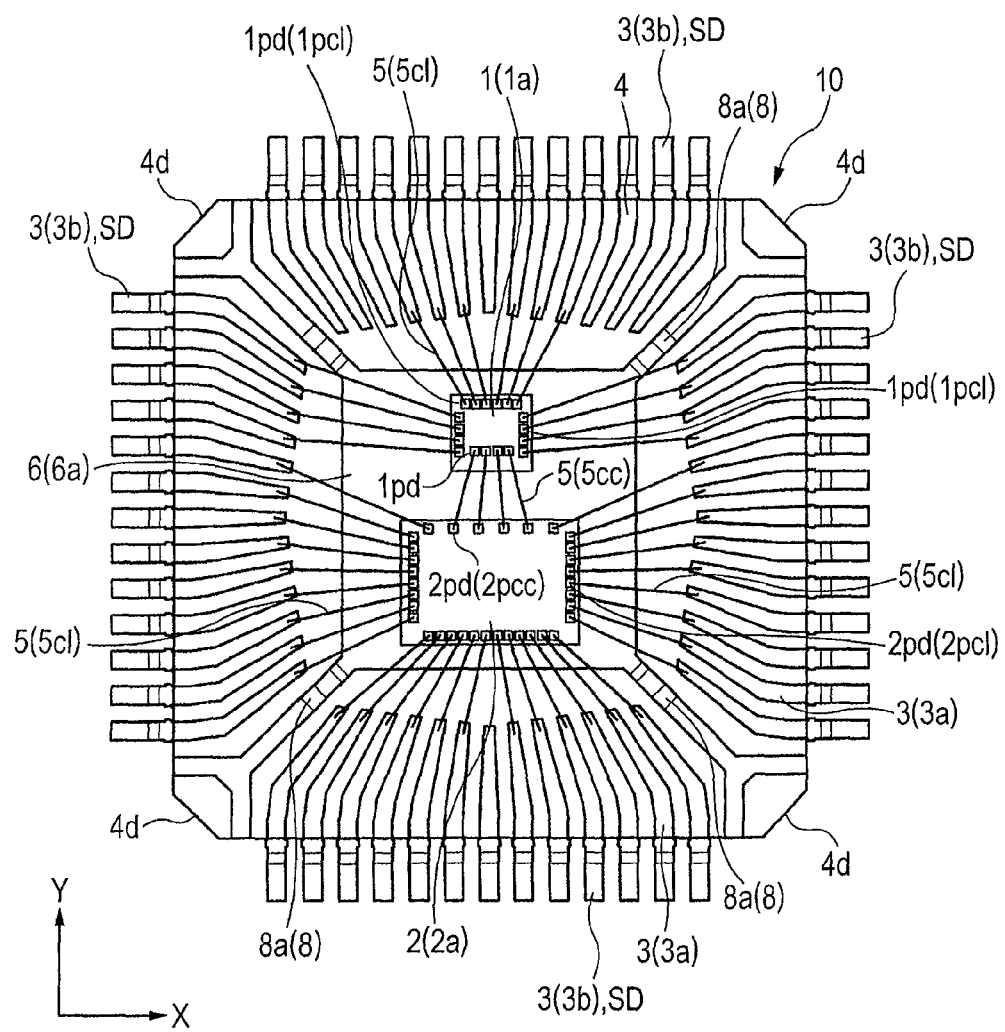
Figure 4:
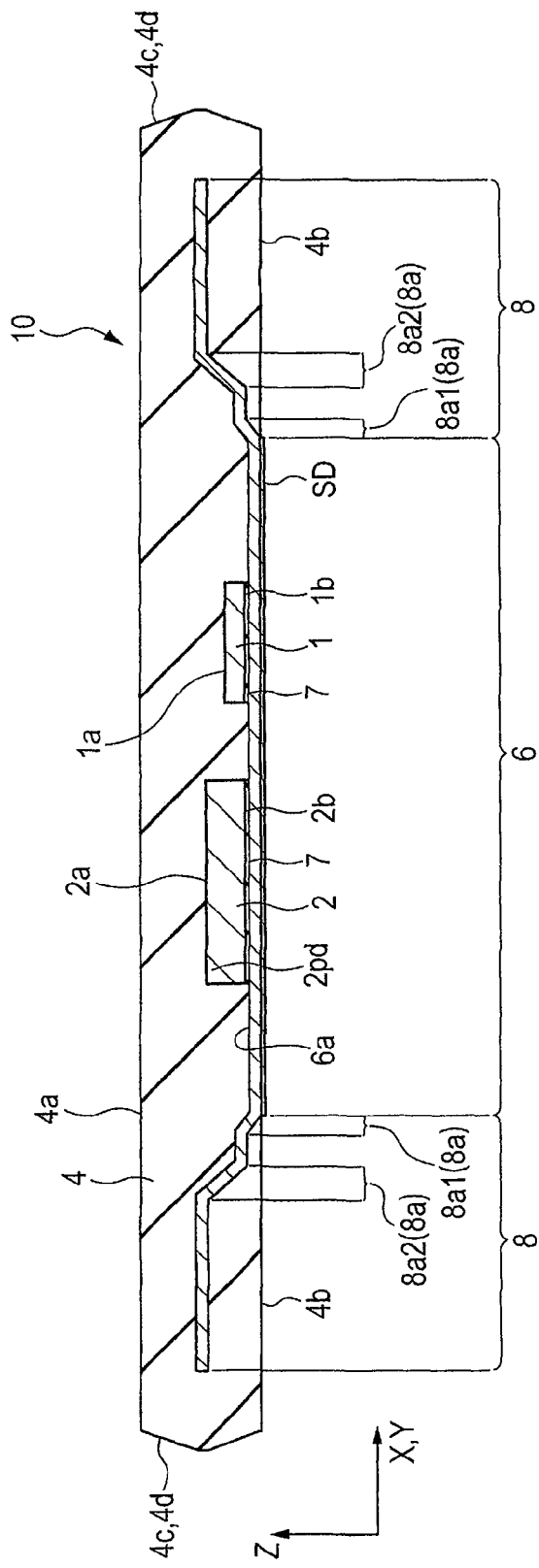
FIG. 4 is a cross-sectional view taken along line B-B of FIG. 1.

First, referring to FIGS. 1 to 4, an outline of a semiconductor device 10 of the present embodiment will be described. FIG. 1 is a plan view showing the semiconductor device of the present embodiment. FIG. 2 is a cross-sectional view taken along line A-A of FIG. 1. Further, FIG. 3 is a perspective plan view showing an internal structure of the semiconductor device where a sealing body shown in FIG. 1 is seen through. Still further, FIG. 4 is a cross-sectional view taken along line B-B of FIG. 1.

As shown in FIGS. 1 to 3, the semiconductor device 10 includes: a semiconductor chip 1 (see FIG. 2 and FIG. 3); a semiconductor chip 2 (see FIG. 2 and FIG. 3); a plurality of leads 3 which are external terminals arranged around the semiconductor chip 1 and the semiconductor chip 2; and a plurality of wires 5 (see FIG. 2 and FIG. 3) which are conductive members electrically coupling the semiconductor chip 1, the semiconductor chip 2, and the leads 3 mutually. Moreover, the semiconductor chips 1 and 2 and the wires 5 are sealed by the sealing body (resin body) 4. Moreover, each inner portion 3a (see FIG. 3) of the leads 3 is sealed by the sealing body 4, and each outer portion 3b of the leads 3 is exposed from the sealing body 4.

As shown in FIG. 1, the semiconductor device 10 includes the sealing body 4 whose planar shape is a quadrangle. The sealing body 4 has an upper surface 4a, a lower surface (back surface, mounting surface) 4b opposite to the upper surface 4a (see FIG. 2); and a plurality of (four) side surfaces 4c between the upper surface 4a and the lower surface 4b.

The sealing body 4 includes a side (main side) S1 which extends in X direction in plan view, a side (main side) S2 opposite to the side S1, a side (main side) S3 which extends in Y direction crossing (orthogonal to) X direction, and a side (main side) S4 opposite to the side S3. Further, the four side surfaces 4c of the sealing body 4 are arranged along the respective sides of the sealing body 4. Also, in the example shown in FIG. 1, corner portions 4d where respective sides of the sealing body 4 cross are chamfered.

In this regard, the corner portion 4d of the sealing body 4 includes a peripheral region of an intersection point where given two sides, among the four sides (four main sides), intersect. Specifically, as shown in FIGS. 1 and 3, since the corner portion 4d of the sealing body 4 is chamfered, the intersection point of the main sides is located on the outside of the corner portion 4d of the sealing body 4. However, the chamfered portion is small enough as compared to lengths of the main sides. Therefore, in the present application, description will be given with a center of the chamfered portion being regarded as a corner of the sealing body 4. That is, in the present application, among the four sides (four main sides) of the sealing body 4, when there is a region where given two sides (two main sides) cross and chamfering is applied to the region, the chamfered portion corresponds to the corner portion 4d. Alternatively, when the region is not chamfered, an intersection point of the given two sides (two main sides) corresponds to the corner portion 4d. Hereafter, in the present application, when the corner portion 4d of the sealing body 4 is referred to, except for a case where such a term is explained as used for specifically different meaning or content, the "corner portion 4d" is used for the same meaning or content as described above.

In the semiconductor device 10, the leads 3 are arranged along respective sides (respective main sides) of the sealing body 4 whose planar shape is a quadrangle. Each of the leads 3 is included of a metal material and, in the present embodiment, for instance, is a metal member including copper (Cu) as a principal component.

Over the side surface 4c of the sealing body 4, the outer portions 3b of the leads 3 project toward the outside of the sealing body 4. Also, over an exposed surface of each of the outer portions 3b of the leads, a metal film (outer plating film) SD included of a solder member, for instance, is formed. By forming the metal film SD such as the solder member over each of the outer portion 3b of the leads being external terminals, it becomes possible to improve wettability of the solder being a joining member when the semiconductor device 10 is mounted over a mounting substrate (not shown). As a result, it becomes possible to improve joining strength between the leads 3 and terminals on the mounting substrate side (not shown).

Further, as shown in FIGS. 2 and 3, a semiconductor chip 1 and a semiconductor chip 2 are sealed inside the sealing body 4. As shown in FIG. 2, the semiconductor chip 1 has a surface 1a and a back surface 1b located opposite to the surface 1a. As shown in FIG. 3, the planar shape of the semiconductor chip 1 is a quadrangle. Over the surface 1a thereof, a plurality of pads (bonding pads) 1pd are formed along respective four sides being an outer circumference of the surface 1a. An insulating film covering the substrate and wiring of the semiconductor chip 1 is formed over the surface 1a of the semiconductor chip 1, and at an opening formed in the insulating film, each surface of the pads 1pd is exposed from the insulating film. Also, the pad 1pd is included of a metal. According to the present embodiment, the pad 1pd contains, for instance, aluminum (Al).

Furthermore, the semiconductor chip 1 (specifically, a semiconductor substrate of the semiconductor chip 1) contains, for instance, silicon (Si). Although not shown, a plurality of semiconductor elements (circuit elements) are formed over the main surface of the semiconductor chip 1 (specifically, a semiconductor element formation region provided in an upper surface of the semiconductor substrate of the semiconductor chip 1). Further, the pads 1pd are electrically coupled with the semiconductor elements via wirings (not shown) formed in a wiring layer arranged inside (specifically, between the surface 1a and the semiconductor element formation region not to be shown) of the semiconductor chip 1. That is, the pads 1pd are electrically coupled with the circuit formed in the semiconductor chip 1. Although details will be described later, for instance, a control circuit is formed in the semiconductor chip 1. Further, at least some of the pads 1pd are electrically coupled with the control circuit.

In addition, as shown in FIG. 2, the semiconductor chip 2 has a surface 2a and a back surface 2b located opposite to the surface 2a. As shown in FIG. 3, the planar shape of the semiconductor chip 2 is a quadrangle whose area is larger than that of the surface 1a of the semiconductor chip 1. Over the surface 2a, a plurality of pads (bonding pads) 2pd are formed along respective four sides being an outer circumference of the surface 2a. As in the case of the pad 1pd described above, each of the pads 2pd is exposed from the insulating film at an opening formed in the insulating film for covering the substrate and wiring of the semiconductor chip 2. Moreover, the pad 2pd contains a metal. According to the present embodiment, the pad 2pd contains, for instance, aluminum (Al).

Also, the semiconductor chip 2 (specifically, a semiconductor substrate of the semiconductor chip 2) contains, for instance, silicon (Si). Although not shown, a plurality of semiconductor elements (circuit elements) are formed over the main surface of the semiconductor chip 2 (specifically, a semiconductor element formation region provided in the upper surface of the semiconductor substrate of the semiconductor chip 2). Further, the pads 2pd are electrically coupled with the semiconductor elements via wirings (not shown) formed in a wiring layer arranged inside (specifically, between the surface 2a and the semiconductor element formation region not to be shown) of the semiconductor chip 2. That is, the pads 2pd are electrically coupled with the circuit formed in the semiconductor chip 2. Although details will be described later, for instance, a memory circuit is formed in the semiconductor chip 2. Further, at least some of the pads 2pd are electrically coupled with the control circuit.

In addition, the semiconductor chip 1 and the semiconductor chip 2 are electrically coupled with the leads 3, respectively. Also, according to the present embodiment, some of the pads 1pd of the semiconductor chip 1 and some of pads 2pd of the semiconductor chip 2 are electrically coupled not via the leads 3 but via the wires 5 with each other. The circuit formed in the semiconductor chip 1 and the circuit formed in the semiconductor chip 2 are electrically coupled to make one system. A semiconductor package thus forming a system by electrically coupling the semiconductor chips sealed inside one sealing body 4 is called a SiP type semiconductor device. There are various examples of application for a system circuit of the SiP type semiconductor device. For instance, an example can be given where there are sealed, in the single sealing body 4, a memory chip in which a memory circuit is formed and a controller chip in which a control circuit for controlling the memory chip is formed. In the case of the example shown in FIG. 3, for instance, the semiconductor chip 2 corresponds to the memory chip in which the memory circuits is formed and the semiconductor chip 1 corresponds to the controller chip in which the control circuit controlling an operation of the memory circuit formed in the semiconductor chip 2 is formed.

As in the present embodiment, the case of building a system by coupling, with each other, the circuits formed in the semiconductor chips can improve versatility thereof better than the case where all the circuits making the system are formed in one semiconductor chip. For example, by changing the type of the memory chip, the capacity of the memory circuit of the system can be changed.

Moreover, as in the present embodiment, when electrically coupling the semiconductor chips mounted in one sealing body 4 not via the leads 3 but via the wires 5, a transmission distance between the semiconductor chips can be shortened. Accordingly, the noise within a transmittal path can be reduced and an electric property can be improved.

Moreover, as shown in FIGS. 2 and 3, each of the semiconductor chip 1 and the semiconductor chip 2 are mounted over a single die pad (chip mounting part) 6. The die pad 6 has an upper surface 6a being a chip mounting surface and a lower surface 6b located opposite to the upper surface 6a. The die pad 6 is included of the same metal material as the lead 3, such as, for instance, the metal material including copper (Cu) as a principal component.

In addition, as shown in FIG. 2, in the lower surface 4b of the sealing body 4, the lower surface 6b of the die pad 6 is exposed from the sealing body 4. That is, the semiconductor device 10 is a die pad exposure type (tab exposure type) semiconductor device. By exposing, from the sealing body 4, the lower surface 6b of the die pad 6 whose heat conductivity is greater than that of the sealing body 4, as compared to a semiconductor device whose die pad 6 is not exposed, a heat dissipating characteristic of the package can be improved. Moreover, when mounting the semiconductor device 10 over the mounting substrate (not shown), if the lower surface 6b of the die pad 6 is coupled with a terminal of the mounting substrate via, for instance, a solder member (joining material), it becomes possible to more efficiently radiate the heat generated in the semiconductor device 10 toward the mounting substrate side.

Incidentally, as a modified example of the present embodiment, it is possible to provide, separately, the chip mounting part over which the semiconductor chip 1 is mounted and the chip mounting part over which the semiconductor chip 2 is mounted. However, from a viewpoint of enlarging the heat radiating area, as in the present embodiment, it is preferable to provide the die pad 6 whose plane area is larger than the sum of the plane areas of the semiconductor chip 1 and the semiconductor chip 2 and to mount the semiconductor chips 1 and 2 over a single die pad 6.

Further, as shown in FIG. 3, around the semiconductor chip 1 and the semiconductor chip 2 (i.e., around the die pad 6), there are arranged, for instance, a plurality of leads 3. Each of the leads 3 has an inner portion 3a sealed by the sealing body 4 and an outer portion 3b exposed from the sealing body. Then, there are electrically coupled, via the wires (conductive members) 5, the pads 1pd formed over the surface 1a of the semiconductor chip 1 and the pads 2pd formed over the surface 2a of the semiconductor chip 2 with the inner portions 3a of the leads 3 located inside the sealing body 4.

The wire 5 contains gold (Au), for instance. Part (for instance, one end) of the wire 5 is joined to the pad 1pd or the pad 2pd, and the other part (for instance, the other end) is joined to the bonding part of the inner portion 3a. Although not shown, a plating film is formed over a surface of the bonding part of the inner portion 3a of the lead 3. The plating film is included of, for instance, a material (for instance, a stack structure where a thin gold (Au) film is formed over a palladium (Pd) film) including silver (Ag), gold (Au), or palladium (Pd) as a principal component. The joining strength with the wire 5 containing gold (Au) can be improved by forming the plating film included of the material (for instance, a stack structure where the thin gold (Au) film is formed over the palladium (Pd) film) including silver (Ag), gold (Au), or palladium (Pd) as a principal component over the surface of the bonding part of the inner portion 3a.

In addition, as shown in FIG. 3, a plurality of suspension leads 8 are arranged around the die pad 6. In a manufacturing step of the semiconductor device 10, the suspension lead 8 is a member for supporting the die pad 6 on a support part of the lead frame. In the example shown in FIG. 3, four suspension leads 8 are arranged from the corner portions of the die pad 6 toward the corner portions 4d of the sealing body 4. Specifically, each one end of the suspension leads 8 is coupled to the corner portion (corner) of the die pad 6. Each of the other ends of the suspension leads 8 extends toward the corner portion 4d of the sealing body 4, branched near the corner portion 4d, and is exposed from the sealing body 4. By extending the suspension leads 8 toward the corner portion 4d of the sealing body 4, the suspension leads 8 can be provided without disturbing rows of the leads 3 arranged along respective sides (respective main sides) of the sealing body 4.

According to the present embodiment, the upper surface 6a of the die pad 6 and the upper surface of the inner portion 3a of the lead 3 are arranged at different levels. In an example shown in FIG. 2, the upper surface 6a of the die pad 6 is lower (lower surface 4d side of the sealing body 4) than the position of the inner portion 3a. In other words, in a thickness direction of the sealing body 4, the die pad 6 rather than the inner portion 3a is arranged on the lower surface 4b side of the sealing body 4. Therefore, in each of the suspension leads 8 shown in FIG. 3, there is provided an offset portion (down-set portion in the example shown in FIG. 3) which is bent such that the upper surface 6a of the die pad 6 is located at a level different from the upper surface of the inner portion 3a of the lead 3.

In addition, as shown in FIG. 4, in the present embodiment, the die pad 6 is exposed from the sealing body 4, in the lower surface 4b of the sealing body 4. Therefore, the difference in level at the offset portion 8a becomes greater. For this reason, in the example shown in FIG. 4, each of the suspension leads 8 has an offset portion 8a1 and an offset portion 8a2 which are bent portions. In addition, in the case of a product whose sealing body 4 is thin, the difference in level at the offset portions 8a becomes small. Therefore, it is not always necessary to provide the offset portions as in FIG. 4. In other words, the number of the offset portions 8a to be provided in the suspension lead 8 may be one.

Further, as shown in FIG. 2, the semiconductor chip 1 is mounted over the die pad 6 via an adhesive material (die bonding material) 7 with its back surface 1b facing to an upper surface 6a of the die pad 6. Also, the semiconductor chip 2 is mounted over the die pad 6 via the adhesive material 7 with its back surface 2b facing to the upper surface 6a of the die pad 6. That is, the semiconductor chip 1 and the semiconductor chip 2 are mounted by a so-called face-up mounting method in which a chip mounting surface (upper surface 6a) is facing to the opposite surfaces (back surfaces 1b and 2b) of the surfaces (main surfaces) 1a and 2a over which the respective pads 1pd and 2pd are formed. The adhesive material 7 is the one for die-bonding the semiconductor chip 2. For this adhesive material, there are used a resin adhesive in which metal particles including silver (Ag) etc. are contained in an epoxy thermosetting resin or a metal bonding material such as a solder member.

<Details of Connection Structure Between Semiconductor Chips>

Figure 5:
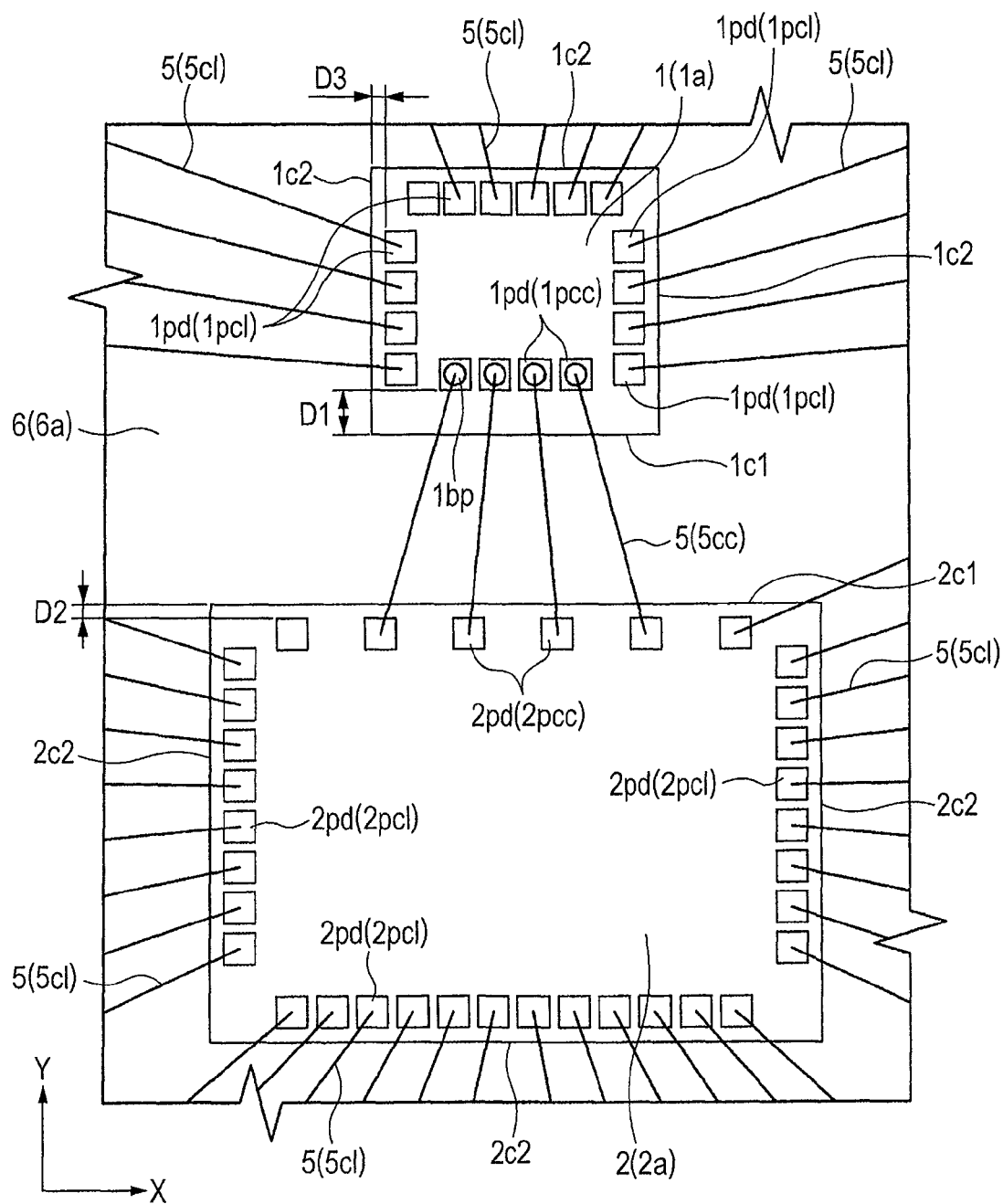
FIG. 5 is an enlarged plan view of a periphery of the semiconductor chip shown in FIG. 3.
Figure 6:
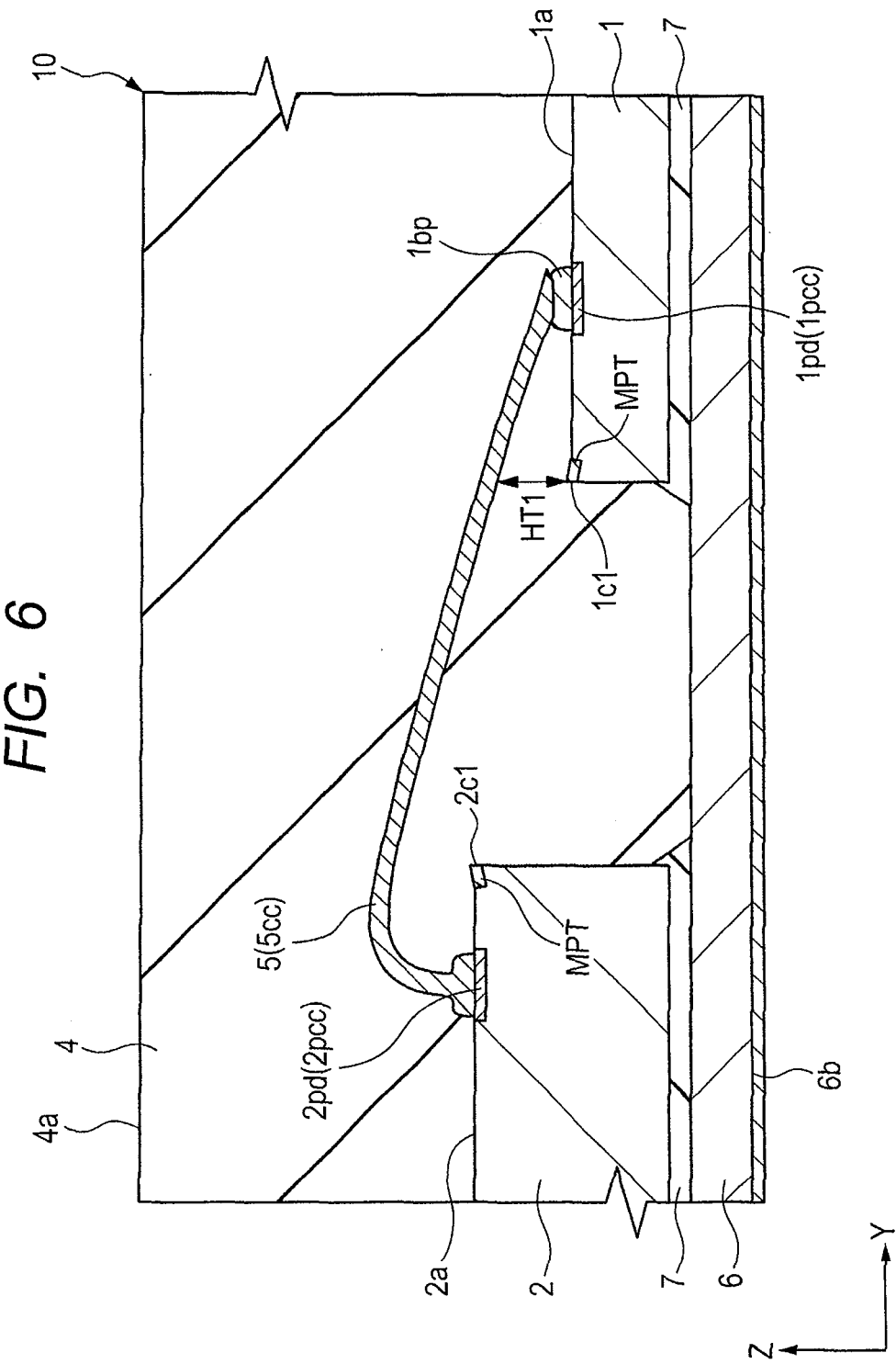
FIG. 6 is an enlarged cross-sectional view of a portion electrically coupling the semiconductor chips shown in FIG. 5.

Next, among the wires 5 shown in FIG. 3, there is described in detail a peripheral structure of a wire 5cc for electrically coupling the semiconductor chip 1 and the semiconductor chip 2. FIG. 5 is an enlarged plan view of a periphery of the semiconductor chip shown in FIG. 3. Also, FIG. 6 is an enlarged cross-sectional view of a portion for electrically coupling the semiconductor chips shown in FIG. 5.

As shown in FIG. 5, over the surface 1a of the semiconductor chip 1 whose planar shape is a quadrangle, a plurality of pads 1pd is arranged along respective sides of the surface 1a. Among the pads 1pd of the semiconductor chip 1, pads 1pcc electrically coupled with the semiconductor chip 2 via the wire 5cc are arranged along, among the sides of the peripheral portion of the surface 1a, a side 1c1 (or a side surface having the side 1c1) facing to the semiconductor chip 2. On the other hand, one end of the wire 5cl is coupled to the pads 1pcl arranged along sides 1c2 (or a side surface having the sides 1c2) except for the sides 1c1 of the semiconductor chip 1. The other end of the wire 5cl is coupled to the lead 3 shown in FIG. 3.

In addition, over the surface 2a of the semiconductor chip 2 whose planar shape is a quadrangle, a plurality of pads 2pd are arranged along respective sides of the surface 2a. Among the pads 2pd of the semiconductor chip 2, pads 2pcc electrically coupled with the semiconductor chip 1 via the wire 5cc are arranged along, among the sides of the peripheral portion of the surface 2a, a side 2c1 (or a side surface having the side 2c1) facing to the semiconductor chip 1. On the other hand, one end of the wire 5cl is coupled to the pads 2pcl arranged along sides 2c2 (or a side surface having the sides 2c2) except for the sides 2c1 of the semiconductor chip 2. The other end of the wire 5cl is coupled to the lead 3 shown in FIG. 3.

Moreover, as shown in FIGS. 2 and 4, a thickness (a distance between the surface 1a and the back surface 1b) of the semiconductor chip 1 of the present embodiment is smaller than a thickness (a distance between the surface 2a and the back surface 2b) of the semiconductor chip 2. In the example shown in FIGS. 2 and 4, for instance, the thickness (a length in Z direction shown in FIG. 2) of the semiconductor chip 1 is about 200 μm, and the thickness of the semiconductor chip 2 is about 400 μm. As a method for electrically coupling the semiconductor chip 1 and the semiconductor chip 2, according to the present embodiment, the pad 1pcc of the semiconductor chip 1 and the pad 2pcc of the semiconductor chip 2 are coupled via the wire 5cc. Thus, when coupling the semiconductor chips 1 and 2 arranged side by side in plan view, via the wire 5, from a viewpoint of forming a wire loop, it is preferable to arrange such that the surface 1a of the semiconductor chip 1 and the surface 2a of the semiconductor chip 2 are at different levels in height. Moreover, it is preferable that the difference in level between the surface 1a and the surface 2a is about 200 μm.

As described above, according to the present embodiment, the thickness of the semiconductor chip 1 is reduced to about 200 μm. Although the reason for this will be described in detail later, when an arrangement pitch of adjacent chip regions is reduced from a viewpoint of increasing the number of semiconductor chips acquired from one semiconductor wafer, unless the semiconductor chip is made thinner, there may occur problems such as chipping in the division-into-pieces step. Therefore, the thickness of the semiconductor chip 1 is as thin as about 200 μm.

Thus, when the semiconductor chip 1 is thin and the semiconductor chips are coupled by the wire 5cc, the sealing body 4 for covering the surface 1a of the semiconductor chip 1 becomes thick. In particular, according to the present embodiment, as described above, the lower surface 6b of the die pad 6 is exposed from the sealing body 4. Therefore, the position of the die pad 6 is considerably offset downward (in a mounting surface direction) than the position of the lead 3.

As a result, as shown in FIG. 2, in a sectional view in which the semiconductor chip 1, the semiconductor chip 2, the die pad 6, and the lead 3 are cut along the thickness direction of the sealing body 4, (a lead frame to be described later), or the semiconductor chips 1 and 2, the surface 1a of the semiconductor chip 1 and the surface 2a of the semiconductor chip 2 are located between an inner portion 3a (specifically, an upper surface 3t of the inner portion 3a) and the die pad 6. In other words, in the thickness direction of the sealing body 4, (the lead frame to be described later), or the semiconductor chips 1 and 2, the level of the surface 1a of the semiconductor chip 1 is located between the upper surfaces 3t of the inner portion 3a of the lead 3 and the upper surface 6a of the die pad 6. Moreover, the level of the surface 2a of the semiconductor chip 2 is located between the upper surface 3t of the inner portion 3a of the lead 3 and the upper surface 6a of the die pad 6. The level described above means a position in the thickness direction (Z direction in FIG. 2) of the semiconductor chip 1, the semiconductor chip 2, the die pad 6, the lead 3, or the sealing body 4.

Therefore, in the present embodiment, the sealing body 4 covering the surface 1a of the semiconductor chip 1 becomes particularly thick. In this occasion, when a thermal load is applied to the semiconductor device 10, there tends to occur a stress resulting from a difference in linear expansion coefficient between a constituent material of the sealing body 4 and a constituent material of the semiconductor chip 1. Moreover, this stress becomes greatest in the peripheral portion of the surface 1a of the semiconductor chip 1. Also, the stress occurs in a direction in which curving deformation occurs with the package (central part of the sealing body 4) as the cardinal point in plan view. Therefore, the stress becomes greatest at a portion which is a central part of the package and which corresponds to the peripheral portion of the surface 1a of the semiconductor chip 1.

As a result of the examination by the inventors of the present application, when the joint of the wire 5cc is arranged at the portion where the stress becomes greater, it has been found out that the joint between the wire 5cc and the pad 1pcc may be damaged due to the stress.

Therefore, according to the present embodiment, the joint between the wire 5cc and the pad 1pcc is placed distantly from the position where the stress becomes greatest. That is, as shown in FIG. 5, arrangement is made to increase a distance D1 between the side 1c1 and the chip-to-chip connection pads 1pcc arranged along the side 1c1 of the surface 1a among the pads 1pd arranged on the surface 1a side of the semiconductor chip 1.

On the other hand, as shown in FIG. 6, the semiconductor chip 2 is thicker than the semiconductor chip 1. Therefore, a joint between the pad 2pd of the semiconductor chip 2 and the wire 5cc is not easily affected by the above stress. Therefore, among the pads 2pd of the semiconductor chip 2, the pad 2pcc to which the wire 5cc is coupled is, like the other pads 2pcl, arranged close to the peripheral portion side of the surface 2a.

For this reason, as shown in FIG. 5, the distance D1 between the side 1c1 and the chip-to-chip connection pads 1pcc of the semiconductor chip 1 is greater than a distance D2 between the side 2c1 and the chip-to-chip connection pads 2pcc arranged along the side 2c1 of the surface 2a among the pads 2pd arranged on the surface 2a side of the semiconductor chip 2.

The following is a comparison of the positions of the pads 1pcc and the pads 1pcl formed over the surface 1a of the semiconductor chip 1. That is, the distance D1 between the side 1c1 and the chip-to-chip connection pads 1pcc of the semiconductor chip 1 is greater than a distance D3 between the side 1c2 and the lead connection pads 1pcl arranged along the side 1c2 of the surface 1a among the pads 1pd arranged on the surface 1a side of the semiconductor chip 1.

It is possible in the semiconductor chip 2 to increase an area of a region (hereafter, referred to as an "active region") in which main circuits such as a logic circuit and a memory circuit are formed and which is provided in the center of the surface 2a by arranging the pads 2pd on the peripheral portion side of the surface 2a. The active region is a portion which overlaps with a semiconductor element formation region for constituting the main circuit including the logic circuit over the main surface (semiconductor element formation surface) of the semiconductor substrate and overlaps with the semiconductor element formation region over the semiconductor substrate in the thickness direction.

On the other hand, in the semiconductor chip 1, some (pads 1pcc) of the pads 1pd are arranged on the inner side than the peripheral portion. Therefore, the area of the active region becomes small. Alternatively, the pads 1pcc are formed in the active region. However, the area of the active region can be increased by arranging each of the pads 1pcl being likely to be affected by the above stress except the pads 1pcc arranged along the side 1c1 closer to the peripheral portion of the surface 1a.

So far, description has been given with regard to the example where each of the pads 1pd and the pads 2pd is formed outside the active region. However, as a modified example, it is possible to form some of the pads 1pd and the pads 2pd or all of them within the active region. In this case, there is required a technique to suppress damage which might be given to the semiconductor elements formed in the active region and the wiring layer caused by an external force at the time of wire bonding. The details will be explained when the method of manufacturing a semiconductor device of the present embodiment is described later.

In addition, as shown in FIG. 6, metal patterns MPT are formed in the peripheral portions of the surface 1a of the semiconductor chip 1 and the surface 2a of the semiconductor chip 2. In a wafer state before the semiconductor chip 1 and the semiconductor chip 2 are divided into pieces, when forming the semiconductor elements and chip wiring, the metal pattern is, for instance, a residue of a test pattern provided to evaluate a formation state.

The above test pattern is called TEG (Test Element Group) and is, in a semiconductor wafer having a plurality of chip regions, formed in a scribe region provided between adjacent chip regions. When dividing the semiconductor wafer into pieces and acquiring the semiconductor chip 1 and the semiconductor chip 2, a cutting process is applied to the scribe region. Therefore, if there is a sufficient margin for processing around TEG formed in the scribe region, it is possible to remove the entire TEG when dividing the semiconductor wafer into pieces.

However, from a viewpoint of increasing the number of semiconductor chips acquired out of one semiconductor wafer, it is preferable to reduce the width of the scribe region. For this reason, during the cutting process, it becomes difficult to secure a sufficient margin for processing around the TEG, and part of TEG remains. The metal pattern MPT shown in FIG. 6 is not limited to part of TEG. However, as one of the reasons for forming the metal pattern MPT, the fact that part of TEG remains as above can be given.

In this regard, when the metal patterns MPT remain in the peripheral portions of the surface 1a of the semiconductor chip 1 and the surface 2a of the semiconductor chip 2, for instance, the contact of the wire 5 with the metal pattern MPT degrades electric reliability. For instance, when the wire 5 comes in contact with the metal pattern MPT, there may be a case where impedance in a transmittal path including the wire 5 varies. Moreover, for instance, there may be a case where adjacent wires 5 are electrically coupled via the metal pattern MPT.

As shown in FIG. 6, one end of the wire 5cc is coupled to the pad 2pcc of the semiconductor chip 2 and the other end is coupled to the pad 1pcc of the semiconductor chip 1. Although details thereof will be described later, according to the present embodiment, in a wire bonding step, after one end of the wire 5cc has been coupled with the pad 2pcc, the other end of the wire 5cc is coupled to the pad 1pcc. In other words, a joint of the wire 5cc and the pad 2pcc is on a first bonding side and a joint of the wire 5cc and the pad 1pcc (specifically, a portion where the wire 5cc is coupled with the pad 1pcc via a projecting electrode 1bp) is on a second bonding side.

The joint of the wire 5cc and the pad 2pcc is located on the first bonding side. Therefore, by forming a wire loop shape bridging the metal pattern MPT of the semiconductor chip 2, it is possible to easily prevent the wire 5cc from coming into contact with the metal pattern MPT of the semiconductor chip 2.

On the other hand, the joint of the wire 5cc and the pad 1pcc is located on the second bonding side. As a result, the wire 5cc tends to come in contact with the metal pattern MPT of the semiconductor chip 1 rather than the metal pattern MPT of the semiconductor chip 2. Therefore, in the semiconductor device 10 according to the present embodiment, the pad 1pcc on the second bonding side is distantly arranged from the peripheral portion of the surface 1a. In other words, as shown in FIG. 5, the distance D1 between the side 1c1 and the chip-to-chip connection pads 1pcc of the semiconductor chip 1 is greater than the distance D2 between the side 2c1 and the chip-to-chip connection pads 2pcc of the semiconductor chip 2.

Accordingly, as shown in FIG. 6, at the peripheral portion of the surface 1a of the semiconductor chip 1, a level difference HT1 between the metal pattern MPT and the wire 5cc can be made greater. As a result, the contact between the wire 5cc and the metal pattern MPT of the semiconductor chip 1 can be suppressed.

Although not shown by a cross-section, among the plurality of pads 1pd formed over the surface 1a of the semiconductor chip 1 in FIG. 5, the pads 1pcl except the chip-to-chip connection pads 1pcc are all on the first bonding side. As shown in FIG. 6, when electrically coupling the semiconductor chips via the wire 5, at least one joint thereof must be on the second bonding side. However, as shown in FIG. 2, when coupling the pad 1pd of the semiconductor chip 1 and the lead 3, the joint with the lead 3 can be on the second bonding side. Therefore, even when the pads 1pcl of the semiconductor chip 1 are arranged closer to the peripheral portion of the surface 1a, the contact with the metal pattern MPT (see FIG. 6) can be suppressed by the loop shape of the wire 5cl.

As a result of this, as shown in FIG. 5, according to the present embodiment, the distance D1 between the side 1c1 and the chip-to-chip connection pads 1pcc of the semiconductor chip 1 is greater than a distance D3 between the side 1c2 and the lead connection pads 1pcl of the semiconductor chip 1.

In addition, as shown in FIGS. 5 and 6, according to the present embodiment, a projecting electrode 1bp is formed over the chip-to-chip connection pad 1pcc. One end of the wire 5cc is joined to the projecting electrode 1bp. In a wire bonding step, there are required, at the joint on the second bonding side, a force for pressing and fixing the wire 5 and a force for cutting the wire 5. Accordingly, as compared to the first bonding side, the stress generated around the pad 1pcc tends to be greater. Therefore, a circuit element arranged directly below the pad 1pcc may be damaged due to the stress. As described above, when the pad 1pcc is arranged in the active region of the semiconductor chip 1, if a member directly below the pad 1pcc is damaged, it may degrade reliability of the semiconductor device 10. In particular, when there is used an insulating material being a so-called Low-k film, whose dielectric constant is reduced, as an insulating material for forming a chip wiring layer which electrically couples a semiconductor element such as a transistor and the pad 1pd, if an external force is applied, a crack is likely to occur.

Therefore, according to the present embodiment, a projecting electrode 1bp is formed over the chip-to-chip connection pad 1pcc, and one end of the wire 5cc is joined to the projecting electrode 1bp. The projecting electrode 1bp contains a relatively soft metal material such as gold, which can reduce stress to be applied to the semiconductor chip 1 when joining the wire 5cc, thereby suppressing the damage on the circuit element arranged in a lower layer of the pad 1pcc.

<Manufacturing Step of Semiconductor Device>

Figure 7:
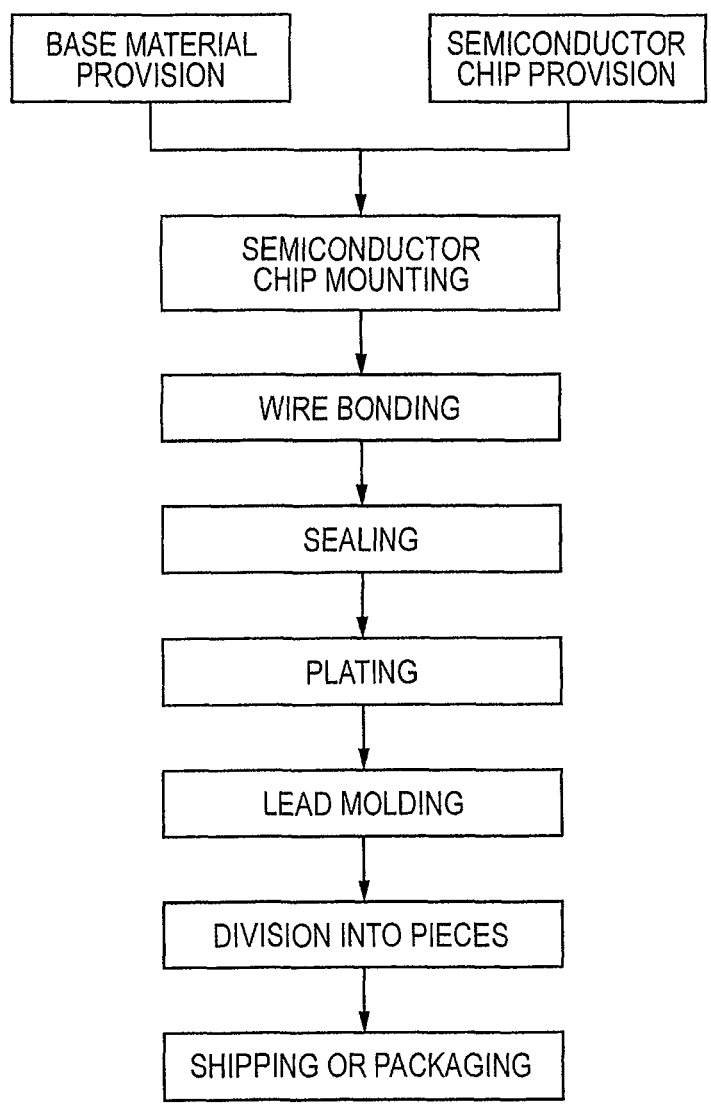
FIG. 7 is an explanatory view showing an assembly flow of the semiconductor device shown in FIGS. 1 to 6.

Next, a manufacturing step of the semiconductor device 10 shown in FIGS. 1 to 6 will be described. The semiconductor device 10 according to the present embodiment is manufactured along an assembly flow shown in FIG. 7. FIG. 7 is an explanatory view illustrating the assembly flow of the semiconductor device shown in FIGS. 1 to 6.

Figure 8:
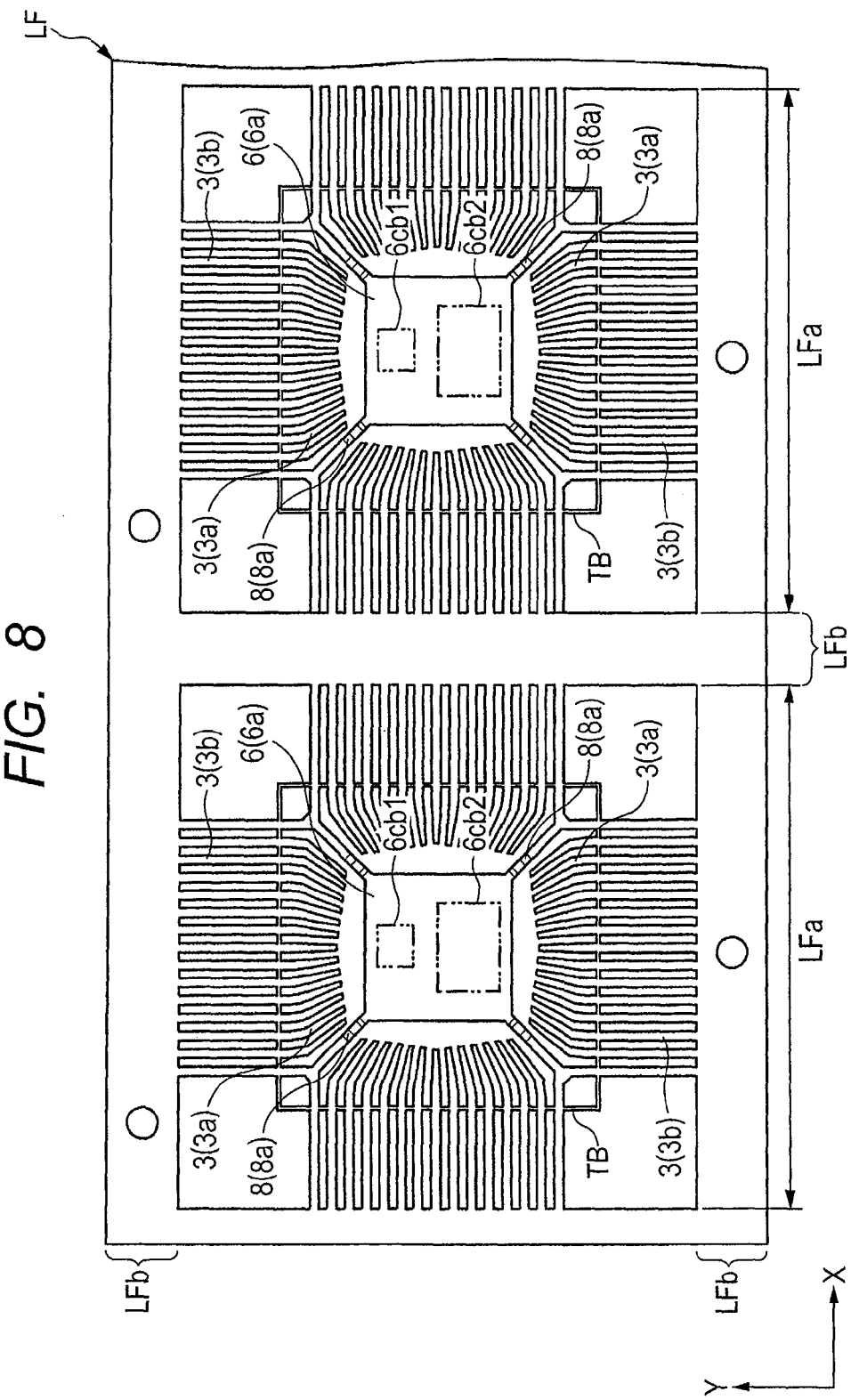
FIG. 8 is an enlarged plan view showing a lead frame provided in a base material provision step shown in FIG. 7.

1. Base Material Provision Step; First, in the base material provision step shown in FIG. 7, a lead frame (base material) LF as shown in FIG. 8 is provided. FIG. 8 is an enlarged plan view illustrating the lead frame provided in the base material provision step shown in FIG. 7.

The lead frame LF provided in this step has, inside a frame portion LFb, a plurality of device formation sections LFa. The lead frame LF is included of a metal. According to the present embodiment, the lead frame LF is included of, for instance, a metal including copper (Cu) as a principal component. Around each device formation section LFa, the frame portion LFb is so arranged as to surround each of the device formation sections LFa. The frame portion LFb is a region which will be cut in a division-into-pieces step (see FIG. 7) to be described later. Also, the frame portion LFb is so formed as to surround the leads 3.

In a central part of each device formation section LFa, there is formed a die pad 6 whose planar shape is a quadrangle. In an upper surface 6a being a chip mounting region of the die pad 6, there are provided a chip mounting region 6cb1 over which the semiconductor chip 1 (see FIG. 3) is to be mounted and a chip mounting region 6cb2 over which the semiconductor chip 2 is to be mounted.

In FIG. 8, positions of the chip mounting region 6cb1 and the chip mounting region 6cb2 are distinctively shown by twp-dot chain lines. However, visible border lines may not be provided in the chip mounting regions 6cb1 and 6cb2 as well as other regions.

To each of the four corner portions of the die pads 6, one end of the suspension lead 8 is coupled and so arranged as to extend toward the corner portion of the device formation section LFa. Also, the other end of the suspension lead 8 is coupled to the frame portion LFb. The die pad 6 is coupled to the frame portion LFb via the suspension lead 8 and is supported by the frame portion LFb.

Further, an offset portion 8a is formed in each of the suspension leads 8 of the lead frame provided in this step. Although reference characters are omitted in FIG. 8 for the sake of illustration, as explained with reference to FIG. 4, each of the suspension leads 8 has an offset portion 8a1 and an offset portion 8a2 being bent portions.

Around the die pad 6, between the suspension leads 8, there are formed a plurality of leads 3, respectively. The leads 3 are coupled to the frame portions LFb, respectively. Further, the leads 3 are coupled with each other via tie bars TB. In addition to the function of coupling the leads 3, in a sealing step shown in FIG. 8, the tie bar TB functions as a dam to prevent resin from overly liquefying and spreading from the supplied site.

Around the die pad 6, between the suspension leads 8, there are formed the leads 3, respectively. Each of the leads 3 is coupled to the frame portion LFb arranged outside the leads 3 with respect to the die pad 6. The frame portion LFb is formed integrally with the leads 3, the suspension leads 8, and the die pad 6.

Figure 9:
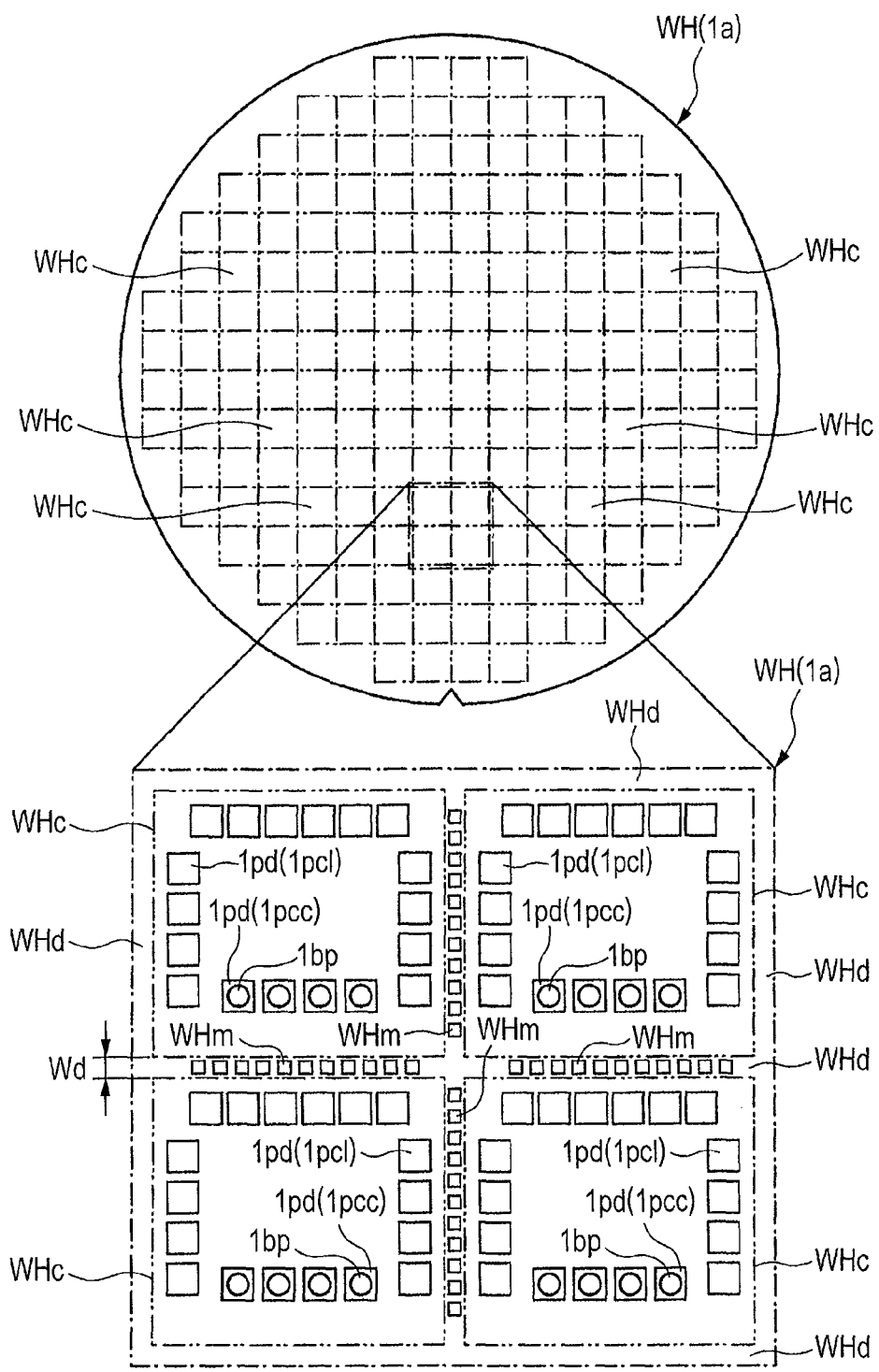
FIG. 9 is a plan view showing an element formation surface side of a semiconductor wafer before the semiconductor chip is acquired in a semiconductor chip provision step shown in FIG. 7.

2. Semiconductor Chip Provision Step; In the semiconductor chip provision step shown in FIG. 7, the semiconductor chip 1 and the semiconductor chip 2 explained with reference to FIGS. 5 and 6 are provided. FIG. 9 is a plan view showing an element formation surface side of the semiconductor wafer before the semiconductor chip is acquired in the semiconductor chip provision step shown in FIG. 7. Except for a planar size, thickness, and circuits to be formed being different, the semiconductor chip 2 shown in FIGS. 5 and 6 can be formed similarly to the way the semiconductor chip 1 is manufactured. Therefore, in the present section, the semiconductor chip 1 will be explained as a typical example.

The circuits, pads 1pd, and projecting electrodes 1bp formed in the semiconductor chip 1 shown in FIG. 5 are formed in a state of a wafer (semiconductor wafer) WH as shown in FIG. 9. The planar shape of the wafer WH is generally circular, and the wafer has a surface (main surface, upper surface) 1a and a back surface (main surface, lower surface) (not shown) opposite to the surface 1a.

The wafer WH has a plurality of chip regions WHc formed in the surface 1a and a scribe region WHd formed between adjacent chip regions WHc among the chip regions WHc. Each of the chip regions WHc corresponds to the semiconductor chip 1 described with reference to FIGS. 5 and 6. Further, over the element formation surface of the semiconductor substrate, there are formed a plurality of semiconductor elements and the pads 1pd electrically coupled with the semiconductor elements. Also, the projecting electrode 1bp is formed in advance as in FIG. 9 over the pad 1pcc, among the pads 1pd, to be electrically coupled to the semiconductor chip 2 shown in FIG. 5.

Further, metal patterns WHm are arranged in the scribe region WHd of the wafer WH. The metal pattern WHm is, for instance, an evaluation element called TEG. The metal pattern WHm is formed so as to inspect whether or not an integrated circuit is properly formed when the integrated circuit included of a plurality of semiconductor elements and wiring layers are formed over the wafer WH. The metals pattern WHm formed in the scribe region WHd is not limited to TEG. For instance, a metal pattern may be formed as an alignment mark. Also, in FIG. 9, a case where a plurality of metal patterns WHm are formed is shown. However, the number of metal patterns WHm is not limitative. There is included, for instance, a case where one metal pattern WHm is arranged in the scribe region WHd or a case where one metal pattern WHm is arranged in a plurality of rows of scribe regions WHd.

The semiconductor chip 1 shown in FIG. 5 can be acquired through dividing each of the chip regions WHc into pieces by cutting along the scribe region WHd shown in FIG. 9. The dividing is done, for instance, such that a dicing blade (not shown) is run along an extended direction of the scribe region WHd and the cutting process is conducted.

In this regard, from a viewpoint of improving the production efficiency of the semiconductor chip 1, it is preferable to increase the occupancy area of the chip region WHc in a single wafer WH and to increase the number of semiconductor wafers to be acquired. In other words, it is preferable that a width Wd of the scribe region WHd is smaller. For instance, in an example shown in FIG. 9, the width Wd is about 60 μm. On the other hand, a planar size of the metal pattern WHm is determined according to its function, miniaturization can only be achieved to a certain degree. For instance, when using the metal pattern WHm as TEG, it is necessary to allow a terminal for inspection (not shown) to come in contact with the metal pattern WHm. In this occasion, it is necessary to determine the planar size in consideration of a contact property of the terminal for inspection, and it is preferable that the planar size is as large as possible. As a result, the metal pattern WHm is arranged close to the chip region WHc.

Accordingly, when the width Wd of the scribe region WHd is reduced to increase the number of semiconductor chips to be acquired, a margin between the metal pattern WHm and the chip region WHc becomes smaller. For this reason, when process precision at the time of cutting the scribe region WHd is taken into consideration, the cutting is conducted so as to leave part of the metal pattern WHm. As a result, as shown in FIG. 6, the metal pattern MPT is formed in the peripheral portion of the surface 1a of the semiconductor chip 1.

In addition, if the width Wd of the scribe region WHd shown in FIG. 9 is narrowed, the cutting width by the dicing blade becomes also smaller. However, with the wafer WH to be cut being thick, if the cutting width is narrowed, there may be a case where there occurs chipping etc. in a portion adjacent to the cutting region. For this reason, according to the present embodiment, the cutting is conducted after grinding the back surface side beforehand such that the thickness of the wafer WH becomes 200 μm or less.

Figure 10:
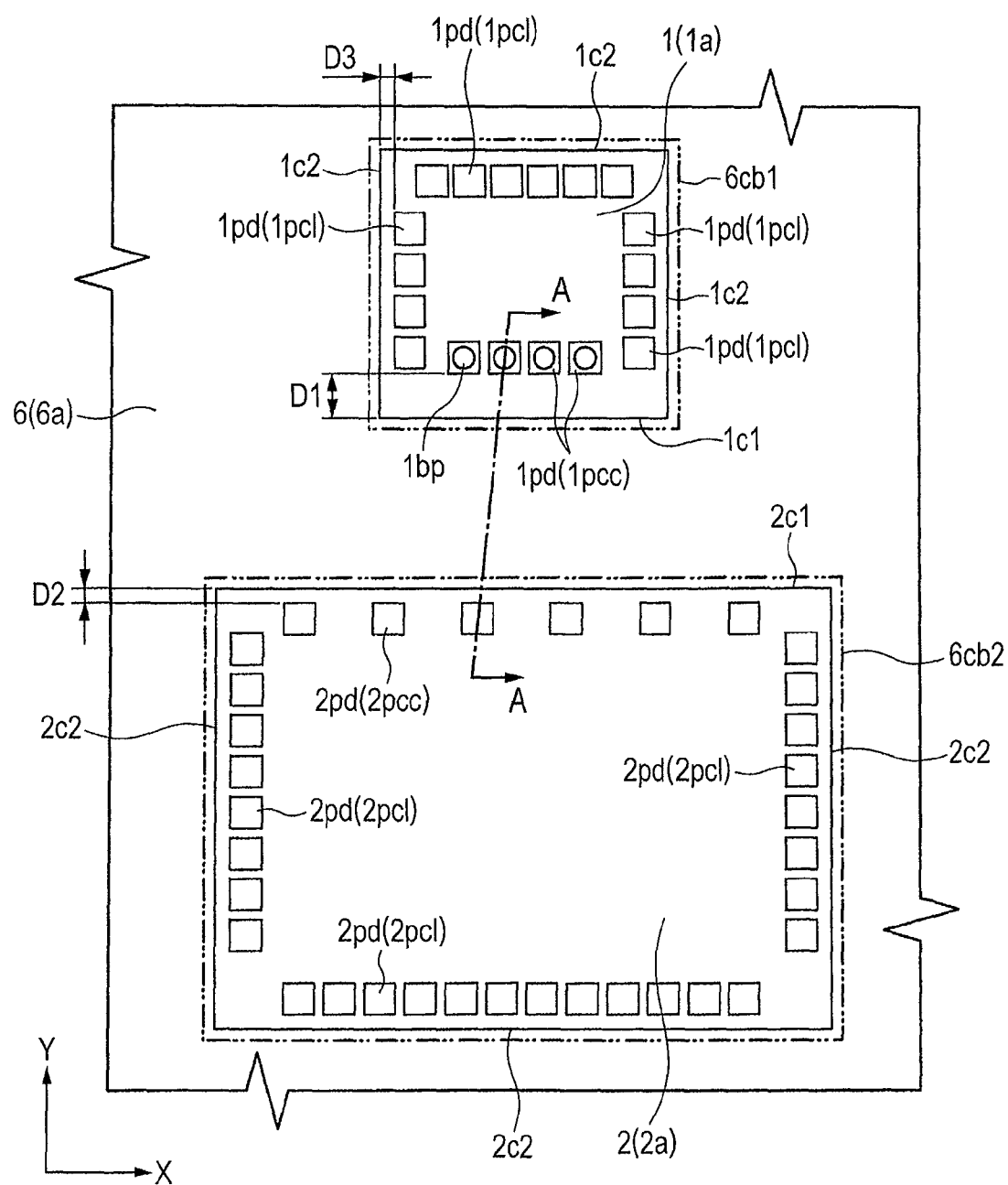
FIG. 10 is an enlarged plan view showing a state after the semiconductor chips have been mounted over a die pad shown in FIG. 8.

3. Semiconductor Chip Mounting Step; Next, in the semiconductor chip mounting step shown in FIG. 7, as in FIG. 10, the semiconductor chip 1 is mounted in the chip mounting region 6cb1 and the semiconductor chip 2 is mounted in the chip mounting region 6cb2, respectively. FIG. 10 is an enlarged plan view showing a state after the semiconductor chips are mounted over the die pad shown in FIG. 8. Moreover, FIG. 11 is an enlarged cross-sectional view taken along line A-A of FIG. 10.

Figure 11:
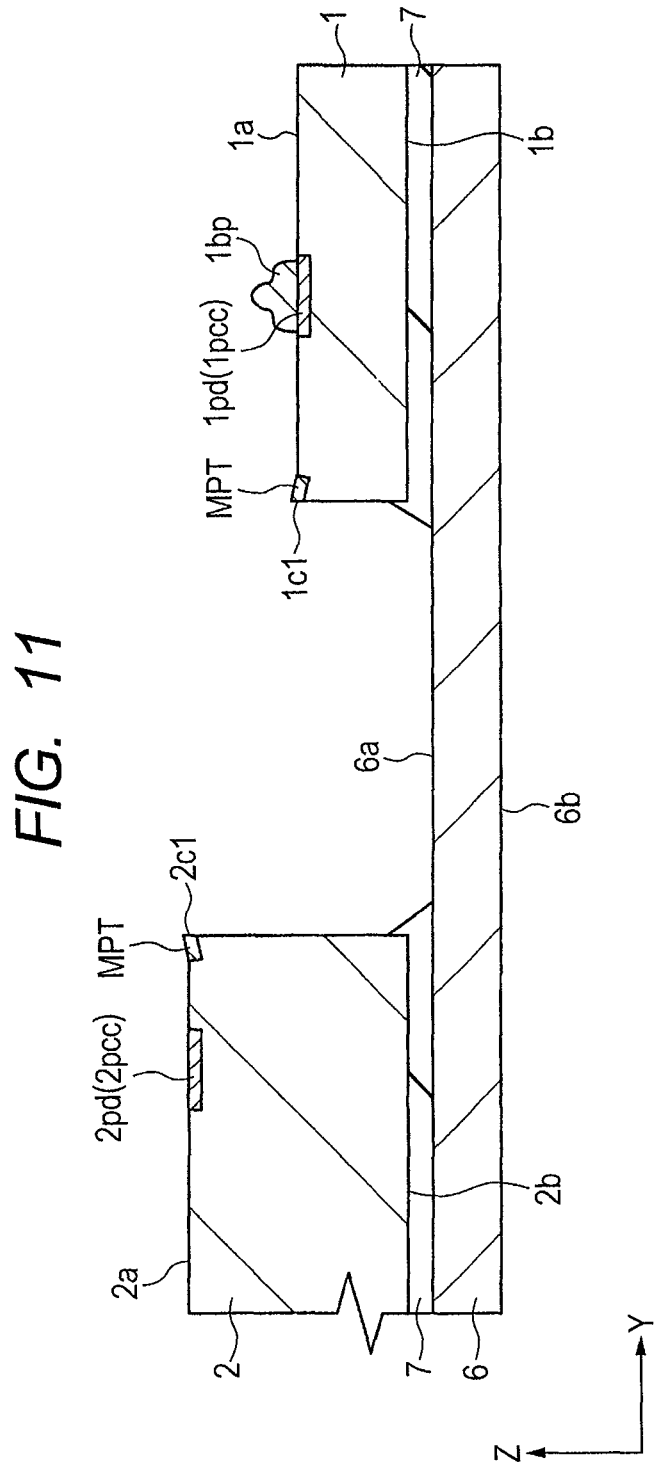
FIG. 11 is an enlarged cross-sectional view taken along line A-A of FIG. 10.

In this step, as shown in FIG. 11, with the back surface 1b of the semiconductor chip 1 facing to the upper surface 6a of the die pad 6, the semiconductor chip 1 is mounted in the chip mounting region 6cb1 (see FIG. 10) of the die pad 6 by a so-called face-up mounting method. Moreover, with the back surface 2b of the semiconductor chip 2 facing to the upper surface 6a of the die pad 6, the semiconductor chip 2 is mounted in the chip mounting region 6cb2 (see FIG. 10) of the die pad 6 by the so-called face-up mounting method.

Also, the semiconductor chip 1 and the semiconductor chip 2 are mounted over the upper surface 6a of the die pad 6 via an adhesive material 7, respectively. Before being hardened (cured), the adhesive material 7 is a flowable paste material. Thus, in using a paste material as the adhesive material 7 like this, first, the adhesive material 7 is applied over the die pad 6 and, then, the back surface 1b (back surface 2b) of the semiconductor chip 1 (semiconductor chip 2) is fixed to the upper surface 6a of the die pad 6. Then, after adhesion, when the adhesive material 7 is cured (for instance, treated with heat), as shown in FIG. 11, the semiconductor chip 1 and the semiconductor chip 2 are adhesively fixed to the die pad 6 via the adhesive material 7.

As for the order of mounting the semiconductor chips, for instance, the semiconductor chip 2 is mounted first and, then, the semiconductor chip 1 is mounted. However, as a modified example, the semiconductor chip 2 can be mounted after the relatively thin semiconductor chip 1 has been mounted. This case is preferable in that a mounting jig is not likely to come in contact with the already mounted semiconductor chip 1 when mounting the semiconductor chip 2.

Additionally, in this step, as shown in FIG. 10, the semiconductor chips 1 and 2 are mounted such that a side 2c1, among the four sides forming the peripheral portion of the surface 2a of the semiconductor chip 2, and the side 1c1, among the four sides forming the peripheral portion of the surface 1a of the semiconductor chip 1 are adjacent to each other. Thus, the distance between the chip-to-chip connection pad 1pcc and the pad 2pcc can be shortened.

In the present embodiment, there has been explained the aspect of using the paste material containing thermosetting resin for the adhesive material 7. However, various kinds of modified examples can be applied. For instance, instead of the paste material, an adhesive material being a tape material (film material) having adhesive layers on both sides thereof may be pasted to the back surface 1b of the semiconductor chip 1 and the back surface 2b of the semiconductor chip 2 in advance, and the semiconductor chips 1 and 2 may be mounted over the die pad 6 via the tape material.

Figure 12:
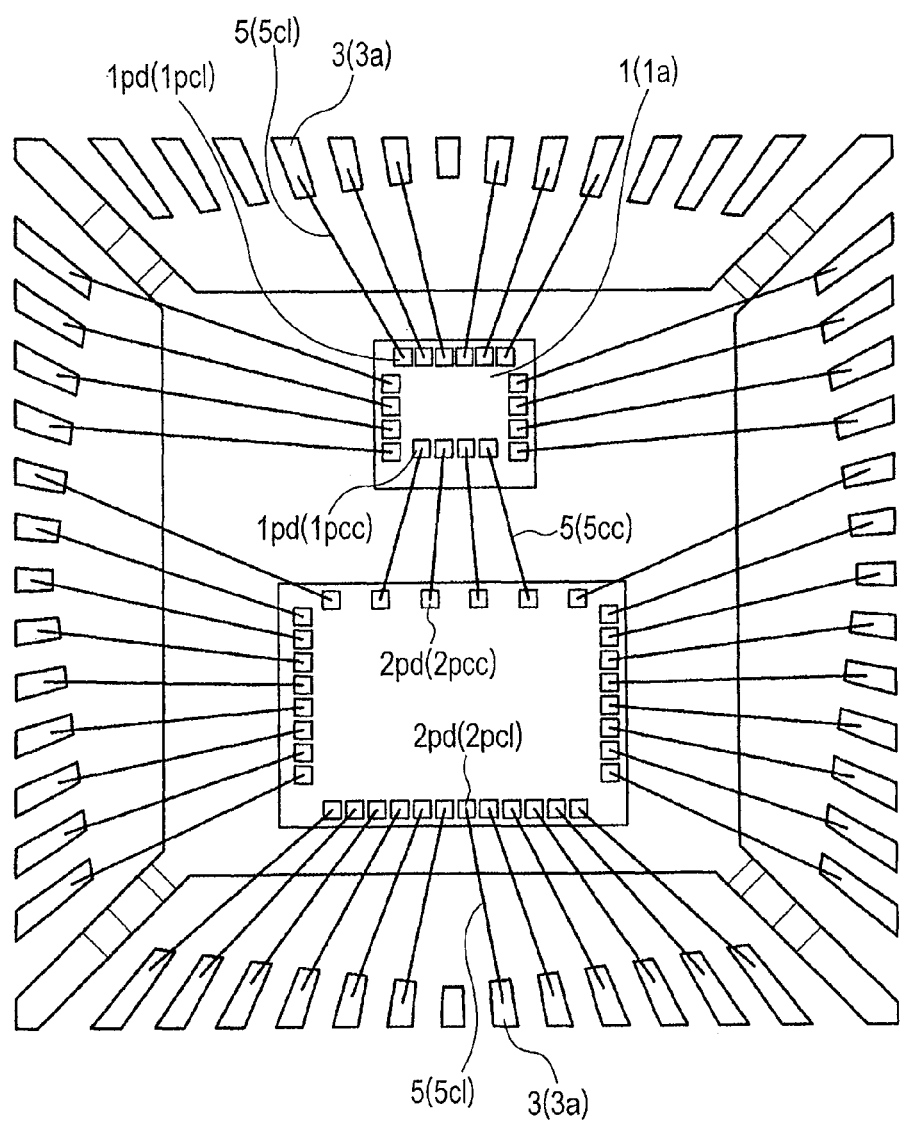
FIG. 12 is an enlarged plan view showing a state where electrical connections are provided between the semiconductor chips shown in FIG. 10 and the leads shown in FIG. 8 as well as among the semiconductor chips shown in FIG. 10.

4. Wire Bonding Step; Next, in the wire bonding step shown in FIG. 7, as in FIG. 12, the pads 1pcl of the semiconductor chip 1 and the leads 3 are electrically coupled, respectively, via wires (conductive members) 5cl. Further, the pads 2pcl of the semiconductor chip 2 and the leads 3 are electrically coupled via the wires 5cl. Still further, the chip-to-chip connection pads 1pcc of the semiconductor chip 1 and the chip-to-chip connection pads 2pcc of the semiconductor chip 2 are electrically coupled via wires 5cc. FIG. 12 is an enlarged plan view showing a state where electrical connections are provided between the semiconductor chips shown in FIG. 10 and the leads shown in FIG. 8 as well as among the semiconductor chips shown in FIG. 10. Also, FIG. 13 is an enlarged cross-sectional view showing the state, as in FIG. 12, where electrical connections are provided among the semiconductor chips as well as between the semiconductor chips and the leads.

Figure 13:
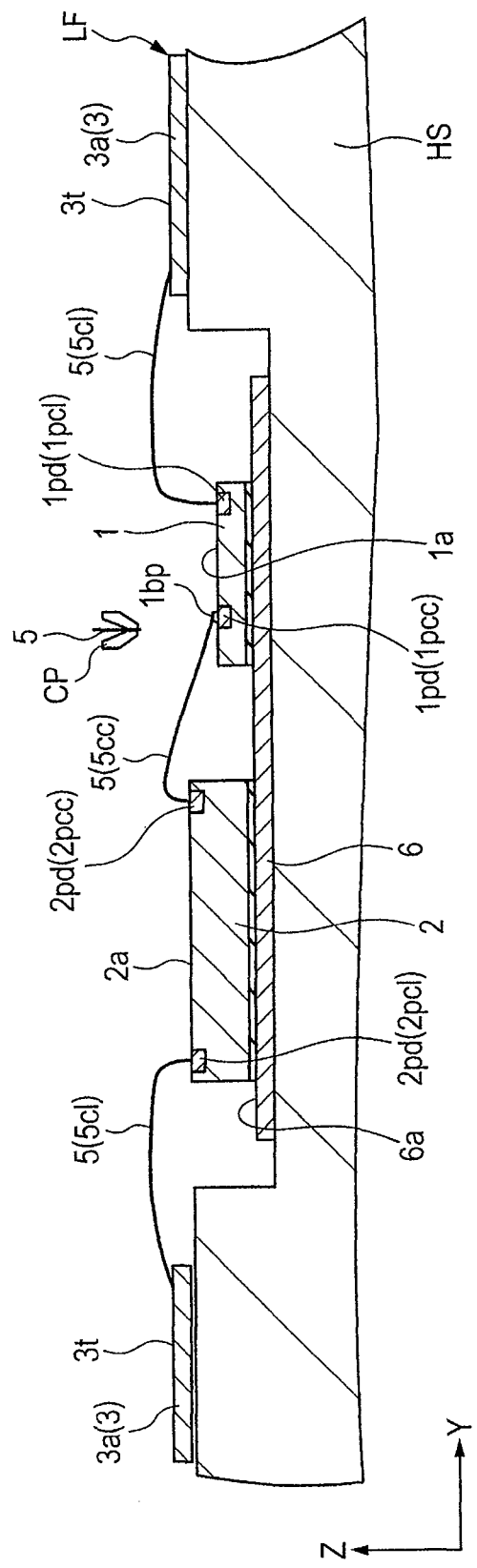
FIG. 13 is an enlarged cross-sectional view showing the state, as in FIG. 12, where there electrical connections are provided among the semiconductor chips as well as between the semiconductor chips and the leads.

In this step, for instance, as shown in FIG. 13, the lead frame LF with the semiconductor chip 1 and the semiconductor chip 2 mounted over the die pad 6 is arranged over a heat stage (lead frame heating board) HS. Then, the pads 1pd of the semiconductor chip 1 and the leads 3, the pads 2pd of the semiconductor chip 2 and the leads 3, and the pads 1pcc of the semiconductor chip 1 and the pads 2pcc of the semiconductor chip 2 are electrically coupled, respectively, via the wires 5.

As for a connection method of the wires 5, for instance, there can be employed a so-called nail head bonding method in which the wires 5 are supplied via a capillary CP, and the wires 5 are joined with use of ultrasound and thermo-compression bonding in combination.

When electrically coupling the pads 1pcl and 2pcl of the semiconductor chips land 2 with the leads 3, respectively, first, one end of the wire 5cl is joined to the pad 1pcl or the pad 2pcl. Subsequently, a loop shape of the wire 5 is formed by moving the wire 5 to the joint (bonding portion) of the lead 3 while sending the wire 5 out of the capillary CP. Upon cutting the wire 5 after having joined the other end of the wire 5cl to the inner portion 3a of the lead 3, electrical connection is provided between the pads 1pcl and 2pcl and the lead 3. That is, in the present embodiment, wire bonding is performed by a so-called forward bonding method with the wire 5cl being bonded first to the pad 1pcl and 2pcl of the semiconductor chips 1 and 2.

Over part of the lead 3 (a bonding portion at the tip of the inner portion 3a), for instance, a plating film (not shown) containing silver (Ag) or gold (Au) is formed, and part of the wire 5 is electrically coupled with the lead 3 via the plating film. Also, the wire 5 is included of a metal, which is gold (Au), for instance, in the present embodiment.

In addition, when electrically coupling the pad 1pcc of the semiconductor chip 1 and the pad 2pcc of the semiconductor chip 2, one end of the wire 5cc is coupled to the pad 2pcc of the relatively thick semiconductor chip 2 first. Subsequently, a loop shape of the wire 5 is formed by moving the wire 5 to the pad 1pcc (specifically, the projecting electrode 1bp) of the semiconductor chip 1 while sending the wire 5 out of the capillary CP. Upon cutting the wire 5 after having joined the other end of the wire 5cc to the projecting electrode 1bp formed over the pad 1pcc in advance, electrical connection is provided between the pad 1pcc and the pad 2pcc. That is, in the present embodiment, the pad 1pcc of the relatively thin semiconductor chip 1 is on the second bonding side.

In this regard, in the present embodiment, as shown in FIG. 10, the pad 1pcc which is on the second bonding side is arranged distantly from the peripheral portion of the surface 1a. In other words, the distance D1 between the side 1c1 and the chip-to-chip connection pads 1pcc of the semiconductor chip 1 is greater than the distance D2 between the side 2c1 and the chip-to-chip connection pads 2pcc of the semiconductor chip 2.

Accordingly, as shown in FIG. 6, at the peripheral portion of the surface 1a of the semiconductor chip 1, a level difference HT1 between the metal pattern MPT and the wire 5cc can be increased. As a result, the contact between the wire 5cc and the metal pattern MPT of the semiconductor chip 1 can be suppressed. Moreover, the pads except the pads 1pcc of the semiconductor chip 1, namely, the pads 1pcl of the semiconductor chip 1 as well as the pads 2pcc and 2pcl of the semiconductor chip 2 are on the first bonding side, respectively. Therefore, with use of the loop shape of the wire 5cl, the contact with the metal pattern MPT (see FIG. 6) can be suppressed at the peripheral portion of the surface 1a or the surface 2a.

In addition, as shown in FIG. 13, the projecting electrode 1bp is formed over the chip-to-chip connection pad 1pcc in advance, and one end of the wire 5cc is joined to the projecting electrode 1bp. For this reason, as compared to the case where the wire 5cc is directly joined to the pad 1pcc, a stress to be applied when pressed and joined can be reduced. Therefore, it becomes possible to suppress the damage given to the circuit element arranged in a lower layer of the pad 1pcc.

Figure 14:
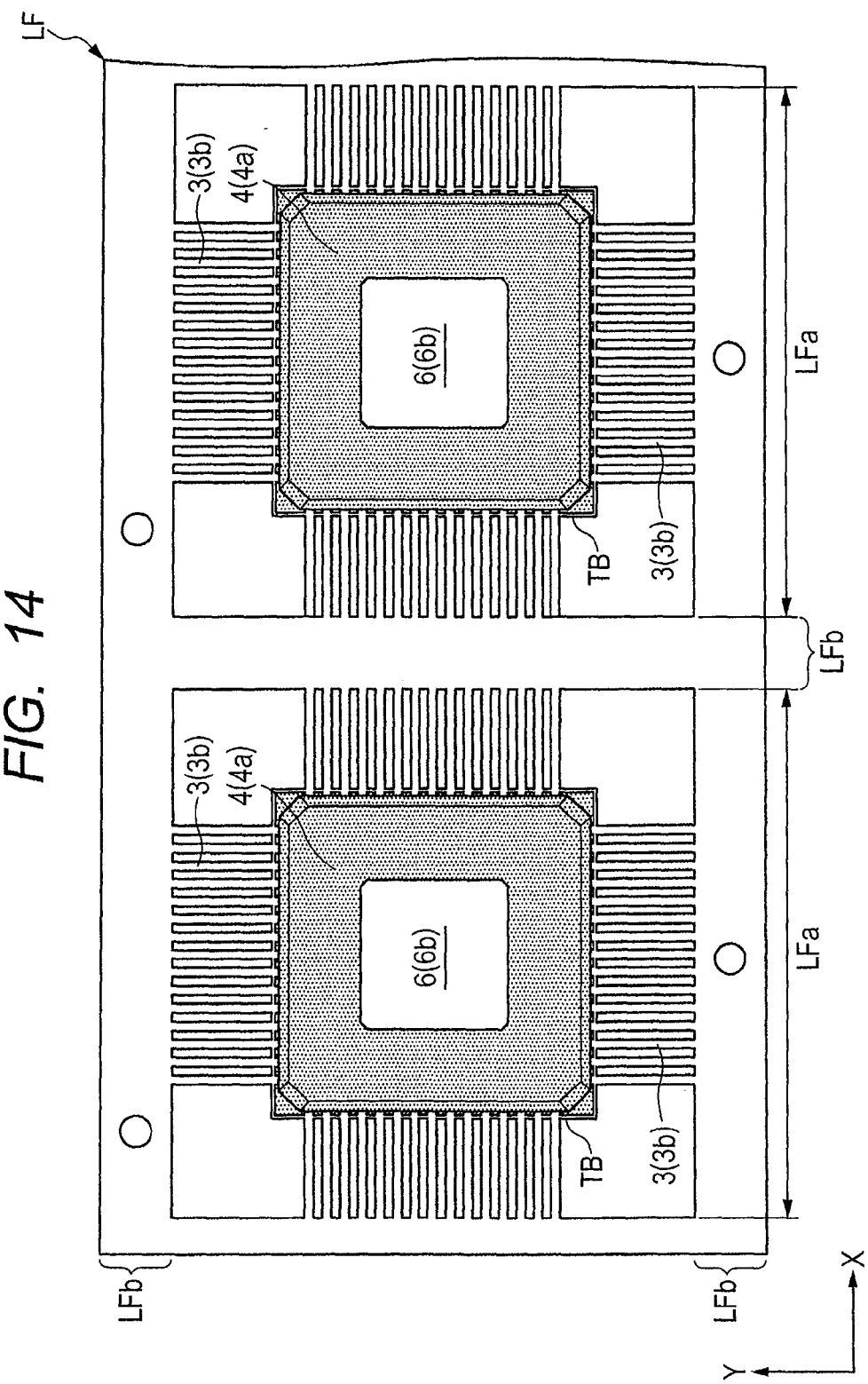
FIG. 14 is an enlarged plan view showing a state on a mounting surface side when the semiconductor chips shown in FIG. 12 are sealed with a resin.
Figure 15:
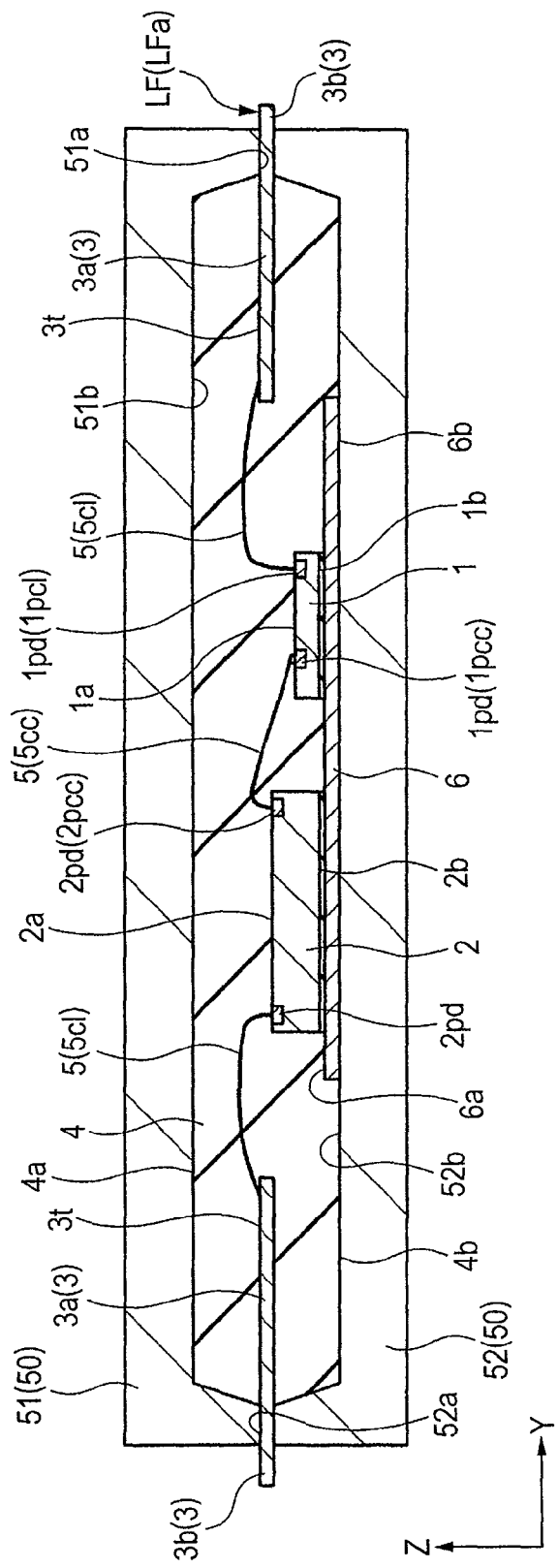
FIG. 15 is a cross-sectional view showing a state, in the sealing step shown in FIG. 7, where the lead frame is arranged in a molding die.

5. Sealing Step; Next, in the sealing step shown in FIG. 7, as in FIG. 14, a sealing body 4 is formed, and the die pad 6, the semiconductor chip 1, the semiconductor chip 2, the wires 5, and the inner portions 3a of the leads shown in FIG. 13 are sealed with a resin. FIG. 14 is an enlarged plan view showing a state of the mounting surface side when the semiconductor chips shown in FIG. 12 are sealed with the resin. Further, FIG. 15 is a cross-sectional view showing a state in the sealing step shown in FIG. 7, where a lead frame is arranged in a molding die.

In this step, as shown in FIG. 14, the sealing body 4 is formed such that the outer portions 3b of the leads 3 provided in each device formation section LFa are exposed, respectively. Moreover, according to the present embodiment, the sealing body 4 is formed such that lower surfaces 6b of the die pads 6 provided in the device formation section LFa are exposed, respectively. In this step, for instance, the sealing body 4 is formed by a so-called transfer mold method in which, with the lead frame LF clamped between an upper part and a lower part of a molding die 50 shown in FIG. 15, a softened resin is pressed and supplied into the molding die 50 and cured.

The molding die 50 includes: an upper die (die) 51 arranged on the upper side of the lead frame LF; and a lower die (die) 52 arranged on the lower side of the lead frame LF. The upper die 51 has a clamp surface (die surface, pressing surface, surface) 51a for pressing the lead frame LF; and a cavity (concave portion) 51b formed inside the clamp surface 51a. Moreover, the lower die 52 includes: a clamp surface (die surface, pressing surface, surface) 52a facing to the clamp surface 51a and pressing the lead frame LF; and a cavity (concave portion) 52b formed inside the clamp surface 52a.

In the sealing step, a sealing resin is pressed into a space formed by combining the cavity 51b and the cavity 52b. Then, the die pad 6, the semiconductor chip 1, the semiconductor chip 2, the wires 5, and the inner portion 3a of the leads are sealed with the resin. Then, by curing the resin supplied to the cavities 51b and 52b, the sealing body 4 is formed.

In this step, the resin is supplied with the lower surface 6b of the die pad 6 being in contact with a bottom surface of the cavity 52b. Alternatively, as a modified example of the present embodiment, when arranging a resin film material in the cavity 52b, the film material is brought into contact with the lower surface 6b of the die pad 6. Thus, by supplying the resin with the lower surface 6b of the die pad 6 being in contact with a molding jig (the lower die 52 or the film material), the sealing body 4 can be formed such that the lower surface 6b being a surface opposite to the chip mounting surface of the die pad 6 is exposed.

According to the present embodiment, as described above, the level of the surface 1a of the semiconductor chip 1 is located between the upper surface 3t of the inner portion 3a of lead 3 and the upper surface 6a of the die pad 6. Moreover, the level of the surface 2a of the semiconductor chip 2 is located between the upper surface 3t of the inner portion 3a of the lead 3 and the upper surface 6a of the die pad 6. Therefore, as compared with a comparative example (not shown) in which the upper surface of the semiconductor chip is higher than the upper surface of the inner portion of the lead, greater amount of resin is supplied over the surface 1a of the semiconductor chip 1 and the surface 2a of the semiconductor chip 2, namely, to the joint portion by the wire 5. In the sealing step, if the amount of resin to be supplied increases, the loop shape of the wire 5 tends to be deformed due to the supply pressure of the resin.

As described above, on the second bonding side of the wire 5cc which couples the semiconductor chips, the distance between the wire 5cc and the surface 1a of the semiconductor chip 1 is shorter than on the first bonding side. For this reason, when the metal pattern MPT (see FIG. 11) is formed in the peripheral portion of the surface 1a, if the wire 5cc is deformed by the supply pressure of the resin, the metal pattern MPT may come in contact with the wire 5cc.

According to the present embodiment, in the sealing step, in a portion which is likely to come in contact with the metal pattern MPT, the pad 1pcc is arranged distantly from the peripheral portion of the surface 1a so that the level difference between the wire 5cc and the surface 1a may become greater. That is, as shown in FIG. 10, there is increased the distance D1 between the side 1c1 and the chip-to-chip connection pads 1pcc arranged along the side 1c1 of the surface 1a, among the pads 1pd arranged on the surface 1a side of the semiconductor chip 1.

On the other hand, with respect to the surface 2a of the semiconductor chip 2, it is possible to easily adjust the level difference between the peripheral portion of the semiconductor chip 2 and the wire 5cc by forming the loop shape of the wire 5cc such that the wire 5cc is extended upward from the joint portion with the pad 2pcc as shown in FIG. 13. Therefore, among the pads 2pd of the semiconductor chip 2, the pads 2pcc to which the wire 5cc is coupled are, similarly to other pads 2pcl, arranged close to the peripheral portion side of the surface 2a.

As a result, as shown in FIG. 10, the distance D1 between the side 1c1 and the chip-to-chip connection pads 1pcc of the semiconductor chip 1 is greater than the distance D2 between the side 2c1 and the chip-to-chip connection pads 2pcc arranged along the side 2c1 of the surface 2a, among the pads 2pd arranged on the surface 2a side of the semiconductor chip 2.

When the pads 1pd formed over the surface 1a of the semiconductor chip 1 are compared with each other, the result is as follows. That is, the distance D1 between the side 1c1 and the chip-to-chip connection pads 1pcc of the semiconductor chip 1 is greater than the distance D3 between the side 1c2 and the lead connection pads 1pcl arranged along the side 1c2 of the surface 1a, among the pads 1pd arranged on the surface 1a side of the semiconductor chip 1. As shown in FIG. 13, there are provided, on the first bonding side of the wire 5cl, the lead connection pads 1pcl arranged along the side 1c2 of the surface 1a, among the pads 1pd arranged on the surface 1a side of the semiconductor chip 1. Therefore, it is possible to easily adjust the level difference between the peripheral portion of the semiconductor chip 1 and the wire 5cc by forming the loop shape of the wire 5cl such that the wire 5cl is extended upward from the joint portion with the wire 5cl over the pad 1pcl. As a result, even if the metal pattern MPT (see FIG. 11) is formed at the side 1c2 (see FIG. 10), the contact between the wire 5cl and the metal pattern MPT can be suppressed.

Figure 16:
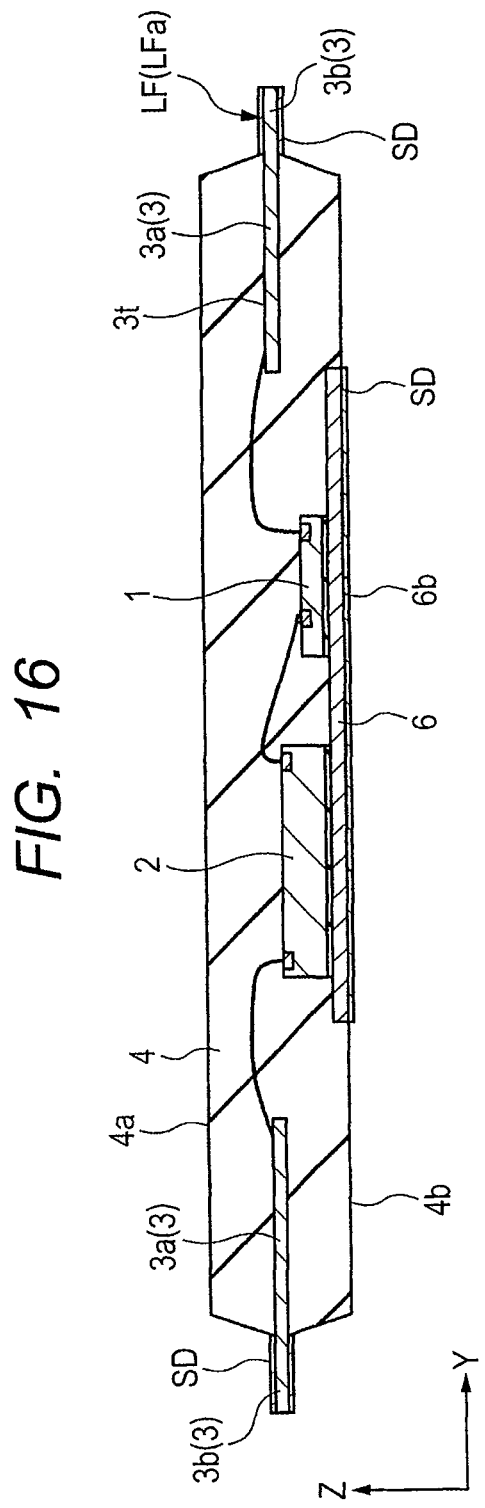
FIG. 16 is an enlarged cross-sectional view showing a state where a metal film is formed over a surface of the lead frame in FIG. 14 exposed from the resin.

6. Plating Step; Next, in the plating step shown in FIG. 7, as in FIG. 16, over the surface of the leads 3 exposed from the sealing body 4, a metal film SD is formed. FIG. 16 is an enlarged cross-sectional view showing a state where the metal film is formed over the surface of the lead frame exposed from the resin shown in FIG. 14.

In this step, over the surface of the metal member exposed from the resin, for instance, the metal film SD included of a solder is formed by the electrolytic plating method. The metal film SD of the present embodiment is included of a so-called lead-free solder, which substantially does not contain lead (Pb). It contains, for instance, tin (Sn) only, tin-bismuth (Sn—Bi) or tin-copper-silver (Sn—Cu—Ag), etc.

When forming the metal film SD by the electrolytic plating method, the metal film SD is formed over the surface of the metal member exposed from the resin. Therefore, according to the present embodiment, the metal film SD is so formed as to cover the upper and lower surfaces of the outer portion 3b of the lead 3 which are exposed to the outside of the sealing body 4. Moreover, according to the present embodiment, at the lower surface 4b of the sealing body 4, the lower surface 6b of the die pad 6 is exposed from the sealing body 4. Therefore, when forming the metal film SD by the electrolytic plating method, the metal film SD is so formed as to cover the lower surface 6b of the die pad 6. Although the film thickness of the metal film SD can be changed according to the product specification, for instance, a film having a thickness of about 10 μm to 20 μm is formed.

Figure 17:
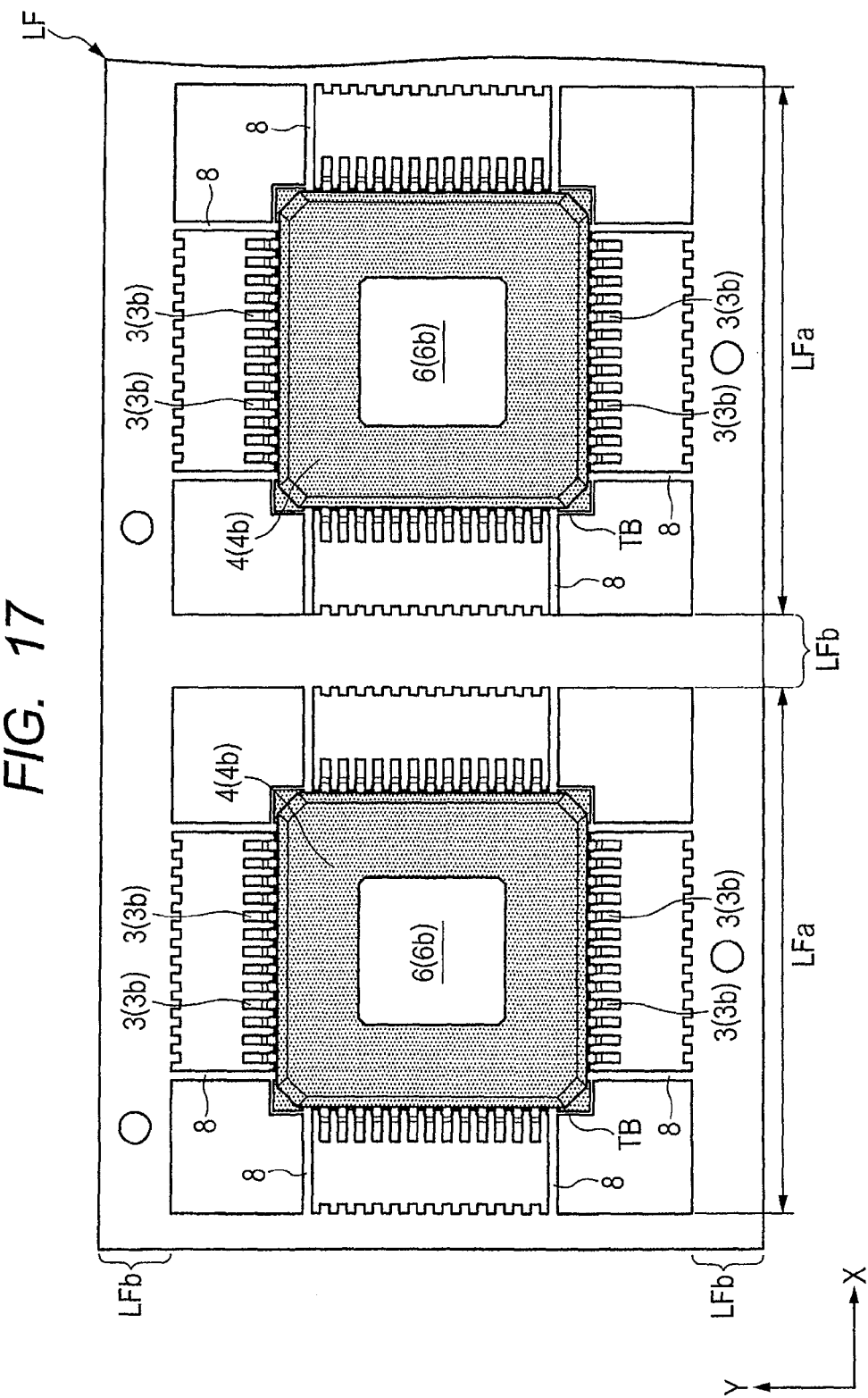
FIG. 17 is an enlarged plan view showing a state where the metal film is formed over the exposed surface of the leads shown in FIG. 14, each of them is cut, and molding is conducted.

7. Lead Molding Step; Next, in the lead molding step shown in FIG. 7, as in FIG. 17, each of the leads 3 is cut, and is bent as shown in FIG. 2. FIG. 17 is an enlarged plan view showing a state where the metal films are formed over exposed surfaces of the leads shown in FIG. 14, cut respectively, and molded.

In this step, the tie bar TB coupling the leads 3 is cut. Further, each of the leads 3 is cut off from the frame portion LFb. Thus, the leads 3 are separated to be independent members. After the leads 3 have been cut off, the sealing body 4 and the leads 3 are supported by the frame portion LFb via the suspension lead 8.

The leads 3 and the tie bar TB can be cut with use of, for instance, a cutter die (not shown) through a pressing process. Further, the leads 3 after having been cut can be molded as shown in FIG. 2, for instance, by bending through a pressing process with use of the molding die (not shown). In this step, the bending process is conducted such that the outer portion 3b of the lead 3 extends toward the mounting surface. In the example shown in FIG. 2, the lower surface 4b side of the sealing body 4 serves as a mounting surface. Therefore, the bending is applied to each of the leads 3 in a direction from the upper surface 4a toward the lower surface 4b of the sealing body 4.

Figure 18:
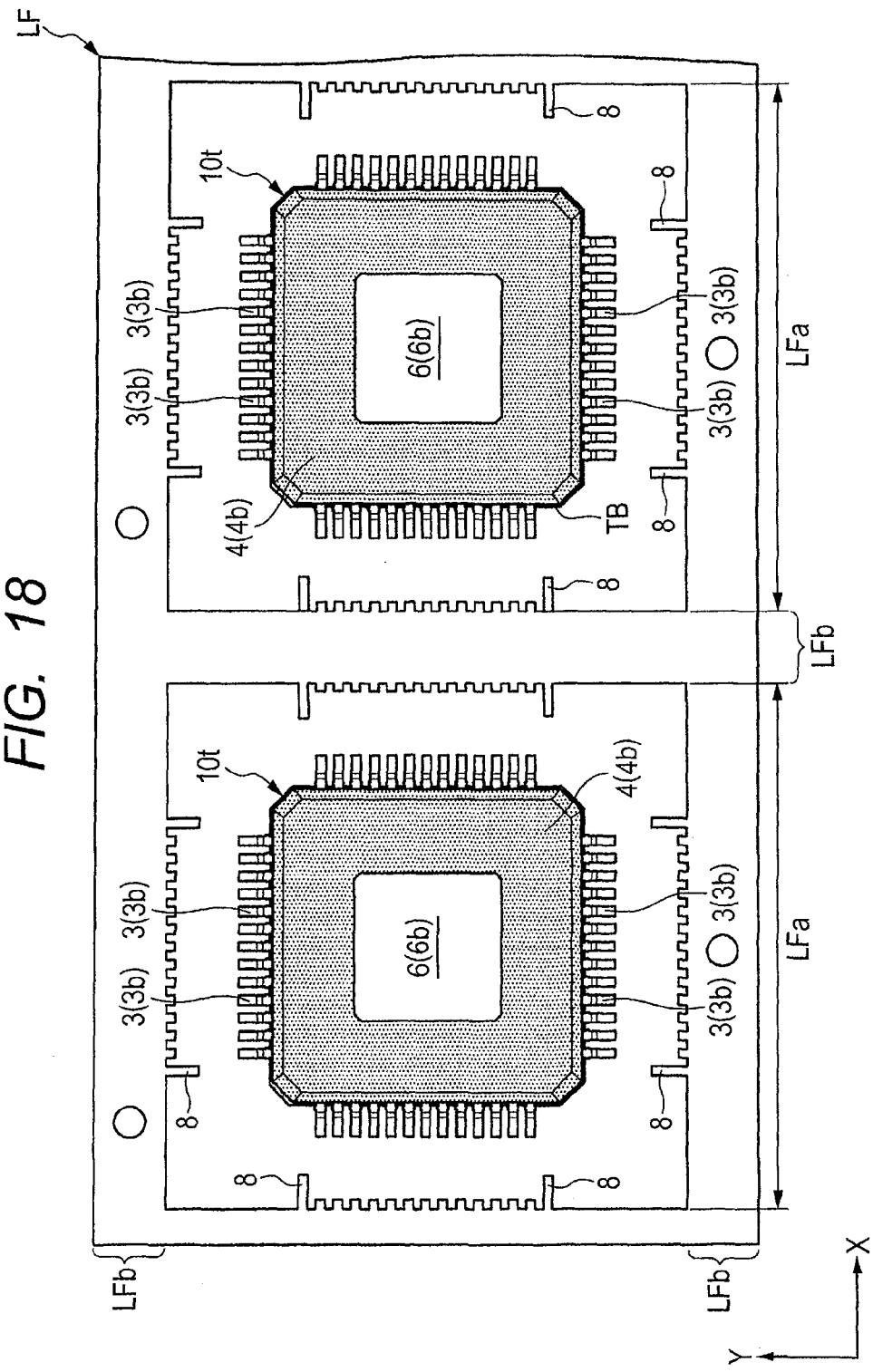
FIG. 18 is an enlarged plan view showing a state where a suspension lead shown in FIG. 17 is cut and divided into pieces for each device formation section.

8. Division-into-Pieces Step; Next, in the-division-into pieces step shown in FIG. 7, as in FIG. 18, each of the suspension leads 8 is cut and, at each of the device formation sections LFa, the semiconductor package is separated. FIG. 18 is an enlarged plan view showing a state shown where the suspension lead shown in FIG. 17 is cut and divided into pieces for each device formation section.

In this step, the suspension leads 8 and the resin left in the corner portion of the sealing body 4 are cut, and a semiconductor device (subject 10t) is acquired. The cutting process is conducted, for instance, as in the above lead molding step, by pressing with use of the cutter die (not shown). Specifically, after this step, requisite inspections and examinations such as an appearance check and an electrical test are performed, and the one passing them will become a completed semiconductor device 10 as explained with reference to FIGS. 1 to 6. Then, the semiconductor device 10 is shipped or mounted over the mounting substrate (not shown).

MODIFIED EXAMPLES

While the invention made by the inventors of the present application has been specifically described according to the embodiments hereinbefore, the invention is not limited to them, and it will be obvious that the various alteration or modification can be made within a scope not departing from the gist of the invention.

Modified Example 1

Figure 19:
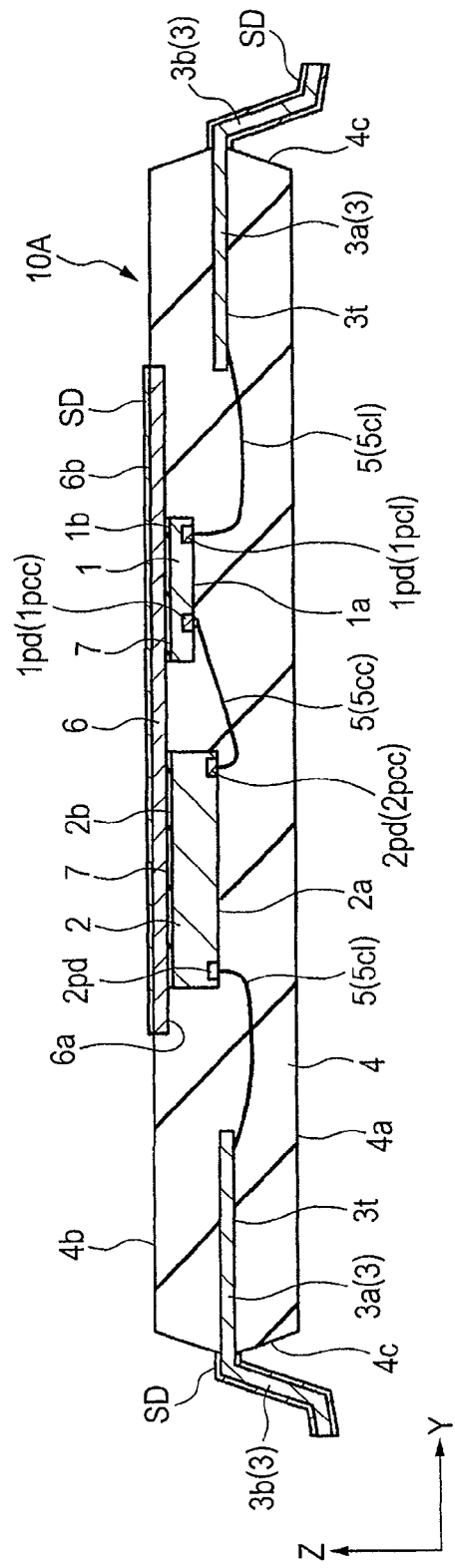
FIG. 19 is a cross-sectional view showing a semiconductor device which is a modified example of the one in FIG. 2.

For instance, according to the present embodiment, as show in FIG. 2, there has been described an aspect where the lower surface 4b of the sealing body 4 serves as the mounting surface and the lower surface 6b of the die pad 6 is exposed on the mounting surface side. However, like a semiconductor device 10A being a modified example shown in FIG. 19, the die pad 6 may be exposed at a surface opposite to the mounting surface. FIG. 19 is a cross-sectional view showing a semiconductor device which is a modified example of the one shown in FIG. 2. The semiconductor device 10A shown in FIG. 19 is formed, in the lead molding step of FIG. 7 described above, when bending is applied to each of the leads 3 in a direction from the lower surface 4b toward the upper surface 4a of the sealing body 4.

In the case of the semiconductor device 10A, other than the direction in which the bending for the outer portion 3b of the lead 3 is conducted, the semiconductor device 10 described in the above embodiment is so configured as to be turned upside down. Therefore, when the mounting surface of the semiconductor device 10A is arranged facing down, each of the surface 1a of the semiconductor chip 1 and the surface 2a of the semiconductor chip 2 is located above the upper surface 3t of the lead 3.

Modified Example 2

Figure 20:
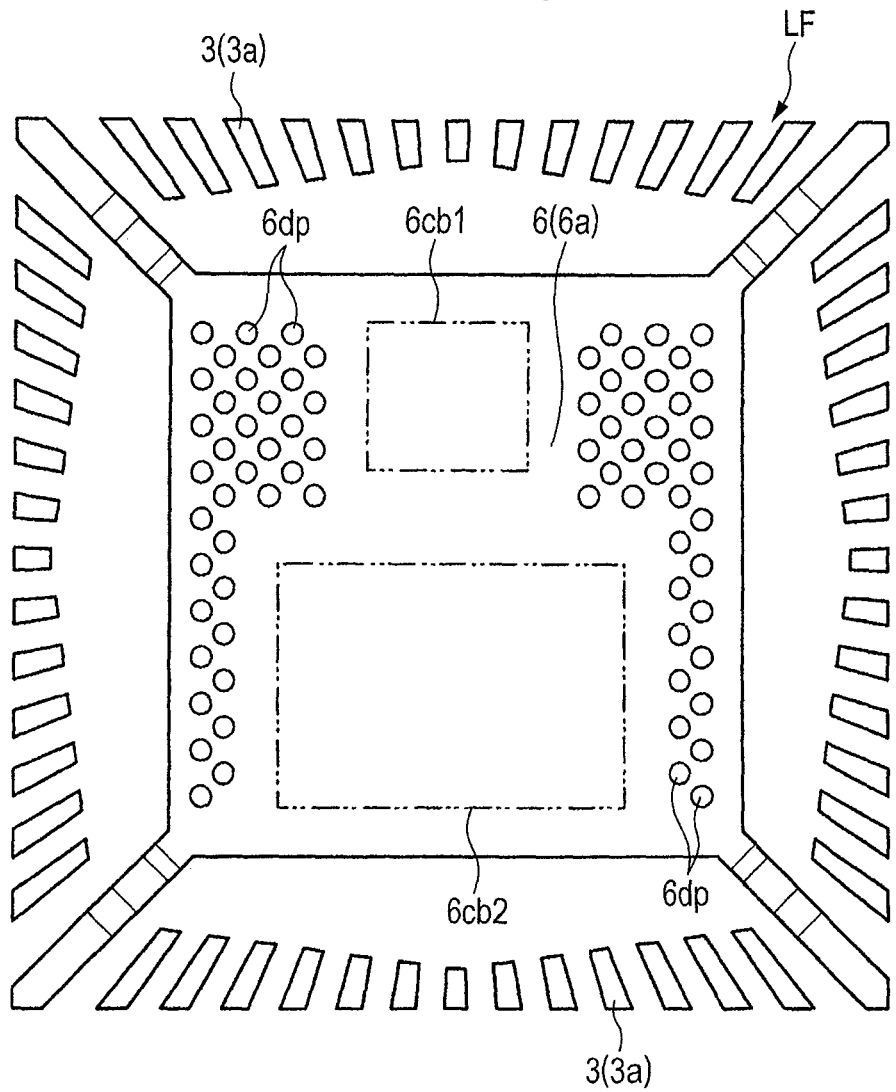
FIG. 20 is an enlarged plan view of a modified example of the die pad shown in FIG. 8.

For instance, in the above embodiment, there has been explained an aspect where, at the chip mounting surface of the die pad 6 shown in FIG. 8, peripheries of the chip mounting region 6cb1 and the chip mounting region 6cb2 are flat. However, like a modified example shown in FIG. 20, there can be formed a plurality of concave portions 6dp around the chip mounting region 6cb1 and the chip mounting region 6cb2. FIG. 20 is an enlarged plan view showing a modified example of the die pad shown in FIG. 8. Also, FIG. 21 is an enlarged cross-sectional view of a periphery of the concave portion shown in FIG. 20.

Figure 21:
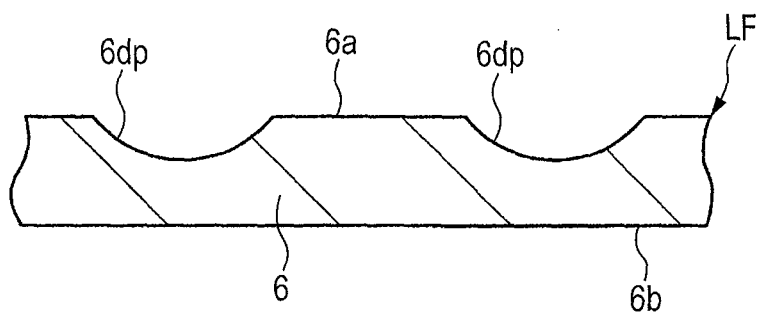
FIG. 21 is an enlarged cross-sectional view of a periphery of a concave portion shown in FIG. 20.

By arranging the concave portions 6dp shown in FIGS. 20 and 21 around the chip mounting regions 6cb1 and 6cb2, it becomes possible to enhance the contact of the die pad 6 and the sealing body 4 (see FIG. 2). Thus, it becomes possible to further tighten the contact of the die pad 6 and the sealing body 4 and to suppress the progress of exfoliation thereof.

Modified Example 3

Figure 22:
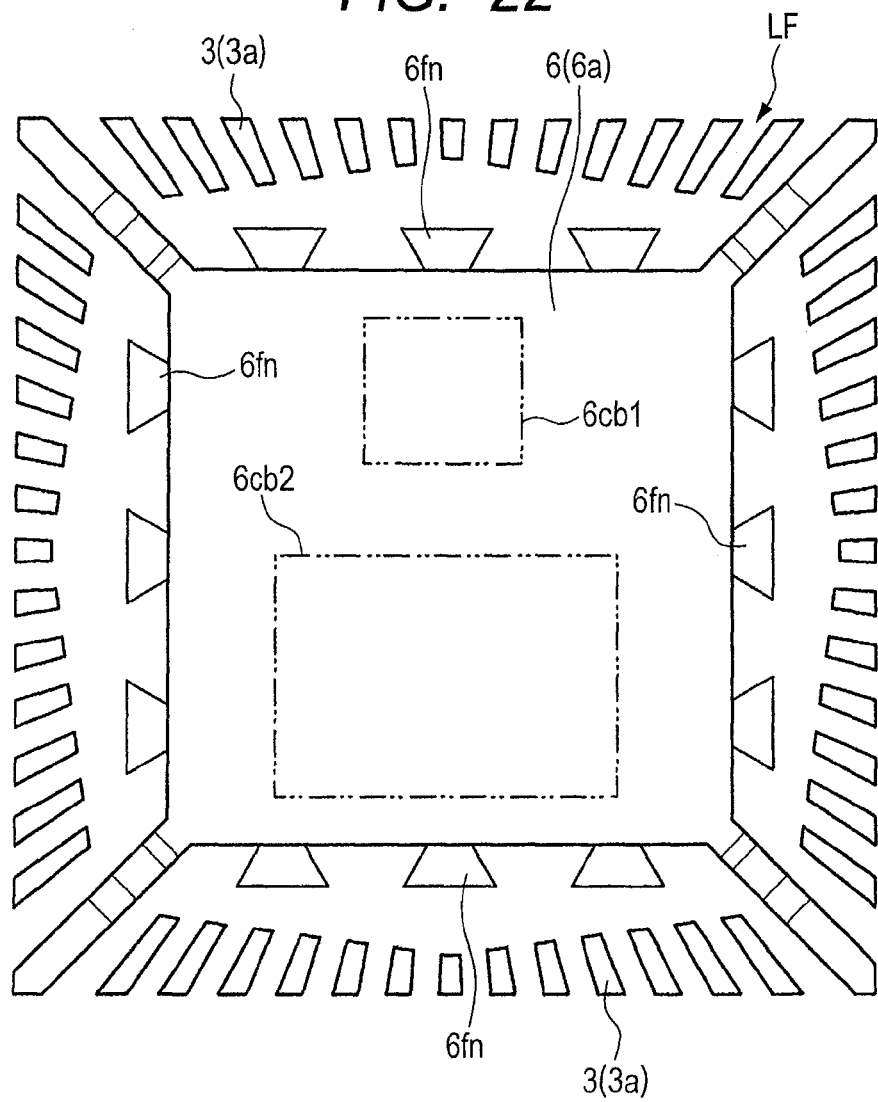
FIG. 22 is an enlarged plan view showing another modified example of the die pad shown in FIG. 8.
Figure 23:
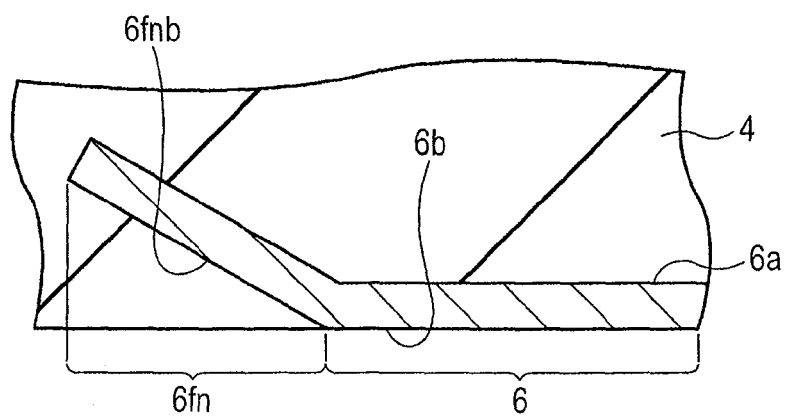
FIG. 23 is an enlarged cross-sectional view of a periphery of a projecting member shown in FIG. 22.

Also, for instance, as a modified example being different from the modified example 2, as shown in FIGS. 22 and 23, a projecting member 6*fn* sealed by the sealing body 4 can be provided at the peripheral portion of the die pad 6. FIG. 22 is an enlarged plan view showing another modified example of the die pad shown in FIG. 8. Also, FIG. 23 is an enlarged cross-sectional view of a periphery of the projecting member shown in FIG. 22.

The projection member 6*fn* shown in FIGS. 22 and 23 is formed integrally with the die pad 6, for instance, and a bending process is applied to a boundary of the die pad 6 and the projecting member 6*fn*. Accordingly, as shown in FIG. 23, the lower surface 6*b* of the die pad 6 is exposed from the sealing body 4, but the lower surface 6*fnb* of the projecting member 6*fn* is sealed by the sealing body 4.

If the projecting member 6*fn* as shown in FIGS. 22 and 23 is provided, after the semiconductor device 10 (see FIG. 2) has been mounted, when a heat cycle load is applied in plan view, it is not likely that a warp occurs with the package (central part of the sealing body 4) as the cardinal point. Therefore, it is possible to further reduce the damage to the joint between the wire 5*cc* and the pad 1*pcc* shown in FIG. 6 due to the influence of the warp of the sealing body 4.

Modified Example 4

As an example of the SiP type semiconductor device, the case has been described in the above embodiment where one semiconductor chip is the memory chip and the other semiconductor chip is the controller chip. However, other than the above, various modified examples can be applied to the system formed by electrically coupling the semiconductor chips. For instance, when making a system by electrically coupling a plurality of control circuits, it is possible to electrically couple a first semiconductor chip and a second semiconductor chip via the wire 5 and to control a first control circuit formed in the first semiconductor chip by a second control circuit formed in the second semiconductor chip.

Modified Example 5

Furthermore, within the scope not departing from the essence of the technical idea described in the above embodiment, the present invention can be applied by combining the modified examples with each other.

What is claimed is:
1. A semiconductor device comprising:
a die pad;
a plurality of suspension leads coupled to the die pad;
a plurality of leads arranged around the die pad in a plan view;
a first semiconductor chip having a first main surface, first pads formed over the first main surface and along each side of the first main surface, and a first back surface opposite to the first main surface and mounted over a first chip mounting region in a chip mounting surface of the die pad;
a second semiconductor chip having a second main surface, the second pads formed over the second main surface and along each side of the second main surface, and a second back surface opposite to the second main surface and mounted over a second chip mounting region in the chip mounting surface of the die pad;
a plurality of first wires coupled to lead connection pads of the first pads of the first semiconductor chip and to a first lead group of the leads;
a plurality of second wires coupled to lead connection pads of the second pads of the second semiconductor chip and to a second lead group of the leads;
a plurality of third wires electrically coupled to chip-to-chip connection pads of the first pads of the first semiconductor chip and to chip-to-chip connection pads of the second pads of the second semiconductor chip; and
a sealing body for sealing the die pad, the first semiconductor chip, the second semiconductor chip, the first wires, the second wires, and the third wires such that part of a surface opposite to the chip mounting surface of the die pad and part of the leads are exposed, respectively,
wherein the first and second semiconductor chips are mounted over the die pad such that a first side of the first main surface and a first side of the second main surface are next to each other,
wherein a distance between the first side of the first semiconductor chip and the chip-to-chip connection pads of the first semiconductor chip formed along the first side of the first semiconductor chip is greater than a distance between the first side of the second semiconductor chip and the chip-to-chip connection pads of the second semiconductor chip formed along the first side of the second semiconductor chip, and
wherein the first and the second main surfaces of the first and the second semiconductor chips are located between the respective leads and the die pad in a thickness direction of the sealing body.

2. The semiconductor device according to claim 1, wherein a thickness of the first semiconductor chip is smaller than a thickness of the second semiconductor chip.

3. The semiconductor device according to claim 2, wherein a metal pattern is formed at a peripheral portion of the main surface of the first semiconductor chip.

4. The semiconductor device according to claim 1, wherein a projecting electrode is formed over each of the chip-to-chip connection pads of the first semiconductor chip and one end of each of the third wires is joined to the projecting electrode.

5. The semiconductor device according to claim 1, wherein a portion of the lead connection pads of the first semiconductor chip are arranged along a second side of the first main surface of the first semiconductor chip, and
wherein a distance between the second side of the first semiconductor chip and the lead connection pads of the first semiconductor chip arranged along the second side of the first semiconductor chip is smaller than a distance between the first side of the first semiconductor chip and the chip-to-chip connection pads of the first semiconductor chip.

6. The semiconductor device according to claim 1, wherein a first bent portion and a second bent portion are formed at each of the suspension leads.

7. The semiconductor device according to claim 1, wherein a plurality of concave portions are formed around the first chip mounting region and the second chip mounting region of the die pad.

8. The semiconductor device according to claim 3, wherein a metal pattern is formed at a peripheral portion of a second surface of the second semiconductor chip.

* * * * *